(12) United States Patent
Choi et al.

(10) Patent No.: US 10,991,598 B2
(45) Date of Patent: Apr. 27, 2021

(54) METHODS OF FABRICATING SEMICONDUCTOR PACKAGES INCLUDING CIRCUIT PATTERNS

(71) Applicant: SK hynix Inc., Icheon-si (KR)

(72) Inventors: Hyeong Seok Choi, Seoul (KR); Hyun Chul Seo, Yongin-si (KR); Seang Hwan Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 45 days.

(21) Appl. No.: 16/448,372

(22) Filed: Jun. 21, 2019

(65) Prior Publication Data

US 2020/0168473 A1 May 28, 2020

(30) Foreign Application Priority Data

Nov. 23, 2018 (KR) .......................... 10-2018-0146297

(51) Int. Cl.
*H01L 21/48* (2006.01)
*H01L 21/66* (2006.01)
*H01L 23/00* (2006.01)

(52) U.S. Cl.
CPC ............ *H01L 21/485* (2013.01); *H01L 22/20* (2013.01); *H01L 24/81* (2013.01); *H01L 2924/3511* (2013.01)

(58) Field of Classification Search
CPC ............................... H01L 21/485; H01L 22/20
USPC ........................................................ 438/106
See application file for complete search history.

(56) References Cited

U.S. PATENT DOCUMENTS 7,145,238 B1 * 12/2006 Huemoeller .......... H01L 21/486
257/750
7,768,116 B2 * 8/2010 Yoon .................... H01L 21/4846
257/690

FOREIGN PATENT DOCUMENTS

KR    1020080085452 A    9/2008
KR    1020130011386 A    1/2013

* cited by examiner

*Primary Examiner* — Jami Valentine Miller
(74) *Attorney, Agent, or Firm* — William Park & Associates Ltd.

(57) ABSTRACT

A method of fabricating a semiconductor package may include forming a plating layer on a surface of a substrate body. A circuit resist pattern and a monitoring resist pattern may be formed on the plating layer, and the plating layer may be etched using the circuit resist pattern and the monitoring resist pattern as etch masks, thereby forming circuit patterns and sub-patterns of a monitoring pattern. A residual rate of the circuit patterns may be monitored by inspecting the number of the sub-patterns of the monitoring pattern remaining on the substrate body after an etch process for forming the circuit patterns and the sub-patterns of the monitoring pattern. A semiconductor chip may be bonded to the circuit patterns using inner connectors.

13 Claims, 24 Drawing Sheets

METHODS OF FABRICATING SEMICONDUCTOR PACKAGES INCLUDING CIRCUIT PATTERNS

CROSS-REFERENCE TO RELATED APPLICATIONS

The present application claims priority under 35 U.S.C 119(a) to Korean Application No. 10-2018-0146297, filed on Nov. 23, 2018, which is incorporated herein by references in its entirety.

BACKGROUND

1. Technical Field

The present disclosure relates to semiconductor packages and methods of fabricating the same.

2. Related Art

In the fabrication of semiconductor packages, bumps have been widely used to connect a package substrate to a semiconductor chip. The bumps are bonded to the package substrate to electrically connect the package substrate to the semiconductor chip. A heating process may be required to bond the bumps to the package substrate. However, the heating process may cause warpage of the package substrate. If the package substrate warps, some of the bumps may be detached from the package substrate to cause electrical disconnection between package substrate and the semiconductor chip.

SUMMARY

According to an embodiment, there is provided a method of fabricating a semiconductor package. The method includes forming a first plating layer on a first surface of a substrate body, and forming first circuit resist patterns and first monitoring resist patterns, each of the first monitoring resist patterns having different widths, on the first plating layer. The first plating layer is etched using the first circuit resist patterns and the first monitoring resist patterns as etch masks, thereby forming first circuit patterns and a first monitoring pattern. The first monitoring pattern is formed to include etched sub-patterns. A first residual rate of the first circuit patterns is monitored by inspecting a number of the etched sub-patterns of the first monitoring pattern remaining on the first surface of the substrate body.

According to another embodiment, there is provided a method of fabricating a semiconductor package. The method includes providing a substrate body on which a first seed layer is formed. The first seed layer is formed on a first surface of the substrate body. A first circuit resist pattern and a first monitoring resist pattern, the first monitoring resist pattern including first monitoring openings with different widths, are formed on the first seed layer. The first circuit resist pattern is formed to provide first circuit openings. First circuit plating layer patterns are formed in the first circuit openings, and first monitoring plating layer patterns are formed in the first monitoring openings. The first monitoring plating layer patterns correspond to plated sub-patterns. The first circuit resist pattern and the first monitoring resist pattern are removed to expose portions of the first seed layer. The exposed portions of the first seed layer are selectively removed. A first residual rate of the first circuit plating layer patterns is monitored by inspecting a number of the plated sub-patterns remaining on the first surface of the substrate body. A semiconductor chip is bonded to the first circuit plating layer patterns using inner connectors.

According to yet another embodiment, a semiconductor package includes first circuit patterns formed on a first surface of a substrate body, second circuit patterns formed on a second surface of the substrate body, the second surface being on an opposite side of the first surface of the substrate body, and a first monitoring pattern including a first group of sub-patterns with different widths, formed on the first surface of the substrate body. The number of the first group of sub-patterns indicates a first residual rate of the first circuit patterns. A second monitoring pattern includes a second group of sub-patterns with different widths, formed on the second surface of the substrate body. The number of the second group of sub-patterns indicates a second residual rate of the second circuit patterns. The second group of sub-patterns constitute a second monitoring pattern. A semiconductor chip is bonded to the second circuit patterns through inner connectors.

DETAILED DESCRIPTION OF THE EMBODIMENTS

Figure 1:
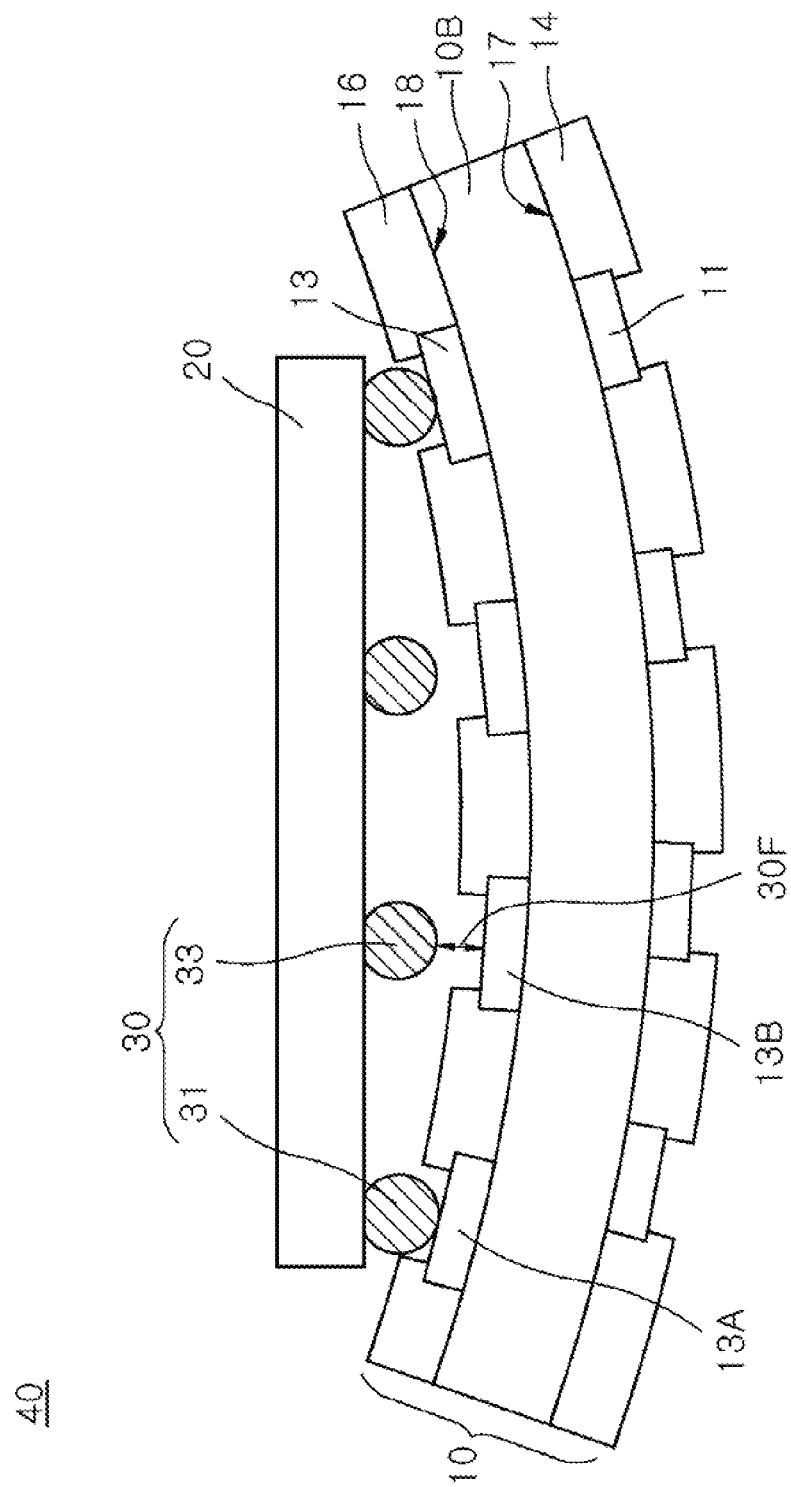
FIG. 1 is a schematic view illustrating a connection failure of a general semiconductor package.

The terms, used herein, may correspond to words selected in consideration of their functions in the embodiments, and the meanings of the terms may be construed to be different according to ordinary skill in the art to which the embodiments belong. If defined in detail, the terms may be construed according to the definitions. Unless otherwise defined, the terms (including technical and scientific terms) used herein have the same meaning as commonly understood by one of ordinary skill in the art to which the embodiments belong.

It will be understood that, although the terms "first," "second," "third" etc. may be used herein to describe various elements, these elements should not be limited by these terms. These terms are only used to distinguish one element from another element, but not used to define only the element itself or to mean a particular sequence.

It will also be understood that, when an element or layer is referred to as being "on," "over," "below," "under," or "outside" another element or layer, the element or layer may be in direct contact with the other element or layer, or intervening elements or layers may be present. Other words used to describe the relationship between elements or layers should be interpreted in a like fashion (e.g., "between" versus "directly between" or "adjacent" versus "directly adjacent").

Spatially relative terms, such as "beneath," "below," "lower," "above," "upper," "top," "bottom" and the like, may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, when the device in the figures is turned over, elements described as below and/or beneath other elements or features would then be oriented above the other elements or features. The device may be otherwise oriented (rotated 90 degrees or at other orientations) and the spatially relative descriptors used herein interpreted accordingly.

In the following embodiments, a semiconductor package may include electronic devices such as semiconductor chips or semiconductor dies. The semiconductor chips or the semiconductor dies may be obtained by separating a semiconductor substrate, such as a wafer, into a plurality of pieces, using a die sawing process. The semiconductor chips may correspond to memory chips, logic chips (including application specific integrated circuits (ASIC) chips), or system-on-chips (SoC). The memory chips may include dynamic random access memory (DRAM) circuits, static random access memory (SRAM) circuits, NAND-type flash memory circuits, NOR-type flash memory circuits, magnetic random access memory (MRAM) circuits, resistive random access memory (ReRAM) circuits, ferroelectric random access memory (FeRAM) circuits or phase change random access memory (PcRAM) circuits which are integrated on the semiconductor substrate. The logic chips may include logic circuits which are integrated on the semiconductor substrate. The semiconductor package may be employed in communication systems such as mobile phones, electronic systems associated with biotechnology or health care, or wearable electronic systems.

Same reference numerals refer to same elements throughout the specification. Even though a reference numeral is not mentioned or described with reference to a drawing, the reference numeral may be mentioned or described with reference to another drawing. In addition, even though a reference numeral is not shown in a drawing, it may be mentioned or described with reference to another drawing.

FIG. 1 is a schematic view illustrating a connection failure of a general semiconductor package 40.

Referring to FIG. 1, the general semiconductor package 40 may be fabricated by mounting a semiconductor chip 20 on a package substrate 10. The package substrate 10 may be a printed circuit board (PCB). The package substrate 10 may be configured to include a substrate body 10B, first circuit patterns 11, second circuit patterns 13, a first dielectric layer 14 and a second dielectric layer 16.

The first circuit patterns 11 and the second circuit patterns 13 may constitute a substrate circuit that electrically connects the semiconductor chip 20 to an external device or an external system. The first circuit patterns 11 and the second circuit patterns 13 may be conductive patterns including a copper material. The first circuit patterns 11 may be formed on a first surface 17 (corresponding to a bottom surface) of the substrate body 10B. The second circuit patterns 13 may be formed on a second surface 18 (corresponding to a top surface) of the substrate body 10B.

The first circuit patterns 11 may be disposed on an opposite surface of the substrate body 10B compared to the second circuit patterns 13. The semiconductor chip 20 may be mounted on the second surface 18 of the substrate body 10B. Inner connectors 30 may be disposed on a surface of the semiconductor chip 20, and the inner connectors 30 may be bonded to the second circuit patterns 13. The inner connectors 30 may be bumps. Outer connectors (not shown) may be disposed on the first surface 17 of the substrate body 10B. The outer connectors may be solder balls that are attached to the first circuit patterns 11.

The first dielectric layer 14 may be disposed on the first surface 17 of the substrate body 10B to fill spaces between the first circuit patterns 11. The first circuit patterns 11 may be electrically insulated from each other by the first dielectric layer 14. The second dielectric layer 16 may be disposed on the second surface 18 of the substrate body 10B to fill spaces between the second circuit patterns 13. The second circuit patterns 13 may be electrically insulated from each other by the second dielectric layer 16. The first and second dielectric layers 14 and 16 may be formed to include a solder resist layer.

The semiconductor chip 20 may correspond to a flip chip, mounted on the second surface 18 of the substrate body 10B. The inner connectors 30, formed on a surface of the semiconductor chip 20, may be in contact with the second circuit patterns 13, and pressure and heat may be applied to the inner connectors 30 to bond the inner connectors 30 to the second circuit patterns 13. This flip chip bonding process may be used to mount the semiconductor chip 20 on the package substrate 10.

In the flip chip bonding process described above, the heat applied to the inner connectors 30 may be conducted to the package substrate 10 to cause a warpage phenomenon of the package substrate 10. If the package substrate 10 warps, distances between the package substrate 10 and the semiconductor chip 20 may locally change. In such a case, although first inner connectors 31, corresponding to some of the inner connectors 30, are in contact with some circuit patterns 13A of the second circuit patterns 13, second inner connectors 33, corresponding to the others of the inner connectors 30, may be spaced apart from the other circuit patterns 13B of the second circuit patterns 13. Thus, while the first inner connectors 31 are still electrically connected to the second circuit patterns 13A, the second inner connectors 33 may be electrically disconnected from the second circuit patterns 13B. Therefore, electrical connection failure between the second inner connectors 33 and the second circuit patterns 13B may occur.

Figure 2:
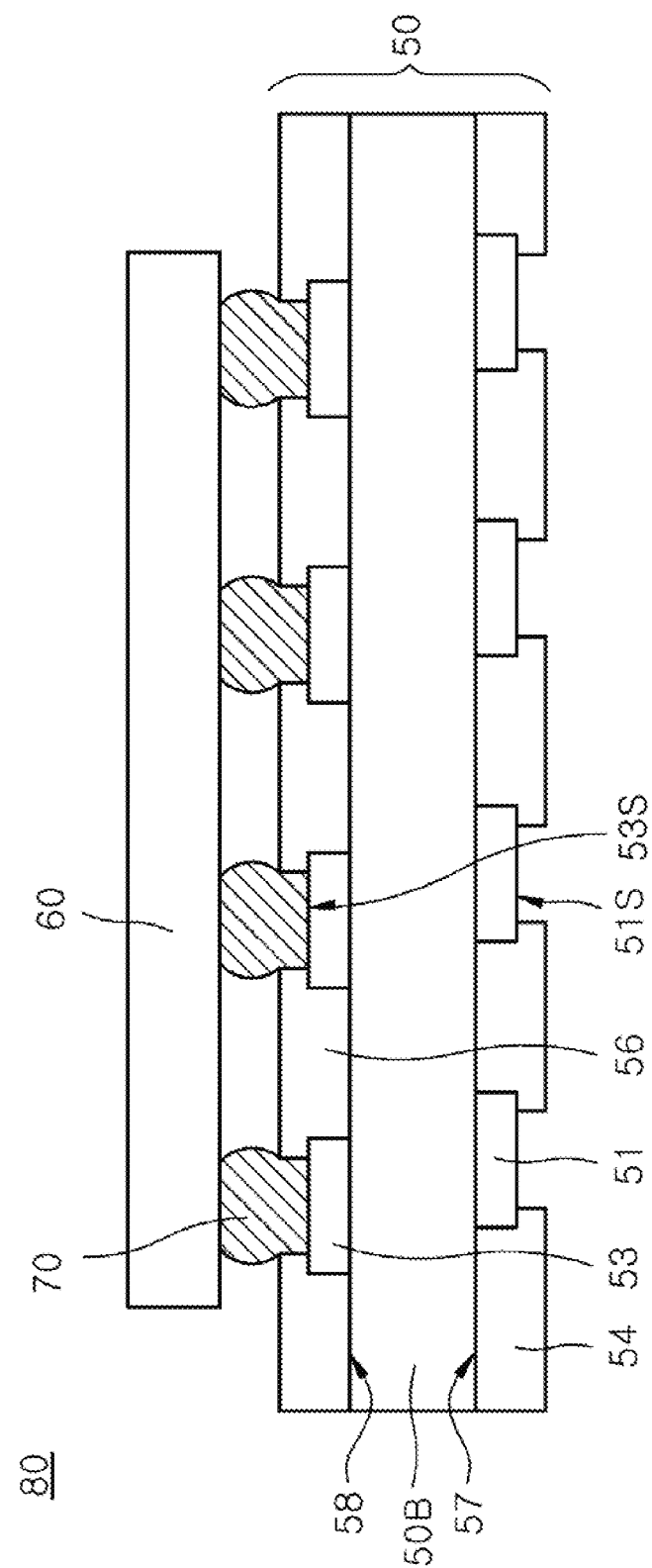
FIG. 2 is a cross-sectional view illustrating a semiconductor package according to an embodiment.

FIG. 2 is a cross-sectional view illustrating a semiconductor package 80 according to an embodiment.

Referring to FIG. 2, the semiconductor package 80 may be configured to include a package substrate 50 and a semiconductor chip 60 mounted on the package substrate 50. The package substrate 50 may be configured to include a substrate body 50B, first circuit patterns 51, second circuit patterns 53, a first dielectric layer 54 and a second dielectric layer 56. A semiconductor chip 60 may be mounted on a second surface 58 of the substrate body 50B in a flip chip form. Inner connectors 70 may be bonded to the second circuit patterns 53 to electrically connect the package substrate 50 to the semiconductor chip 60.

During the flip chip bonding process for electrically connecting the inner connectors 70 to the second circuit patterns 53, it may be necessary to suppress local change of a distance between the package substrate 50 and the semiconductor chip 60. In order to suppress the local change of a distance between the package substrate 50 and the semiconductor chip 60, it may be necessary to strengthen a warpage-resistant property of the package substrate 50 first.

The warpage-resistant property of the package substrate 50 may be strengthened if a residual rate (i.e., a first residual rate) of the first circuit patterns 51, formed on a first surface 57 of the substrate body 50B, opposite to the semiconductor chip 60, is substantially equal to a residual rate (i.e., a second residual rate) of the second circuit patterns 53, formed on the second surface 58 of the substrate body 50B. If a difference between the first residual rate of the first circuit patterns 51 and the second residual rate of the second circuit patterns 53 is within an allowable range, the warpage of the package substrate 50 may be effectively suppressed even though the flip chip bonding process is performed. On the contrary, if a difference between the first residual rate of the first circuit patterns 51 and the second residual rate of the second circuit patterns 53 is out of the allowable range, the package substrate 50 may warp due to the heat applied to the package substrate 50, causing an electrical connection failure between the package substrate 50 and the semiconductor chip 60 during or after the flip chip bonding process as described with reference to FIG. 1.

The first residual rate of the first circuit patterns 51 means a ratio of a total surface area of the first circuit patterns 51 to a surface area of the first surface 57 of the substrate body 50B. In such a case, the total surface area of the first circuit patterns 51 may correspond to a total surface area of top surfaces 51S of the first circuit patterns 51. The second residual rate of the second circuit patterns 53 means a ratio of a total surface area of the second circuit patterns 53 to a surface area of the second surface 58 of the substrate body 50B. In such a case, the total surface area of the second circuit patterns 53 may correspond to a total surface area of top surfaces 53S of the second circuit patterns 53.

The first circuit patterns 51 and the second circuit patterns 53 may be designed such that the first residual rate of the first circuit patterns 51 is substantially equal to the second residual rate of the second circuit patterns 53. Nevertheless, after the first circuit patterns 51 and the second circuit patterns 53 are formed on the substrate body 50B, the first residual rate of the first circuit patterns 51 may be different from the second residual rate of the second circuit patterns 53. This may be due to the difference between an etch rate of a first etchant, for forming the first circuit patterns 51, and an etch rate of a second etchant, for forming the second circuit patterns 53, even though the first etchant and the second etchant are the same etchant. The etch rate of the etchant may vary according to the number of times that the etchant is used and a total time that the etchant is used.

If a difference value between the first residual rate of the first circuit patterns 51 and the second residual rate of the second circuit patterns 53 is within the range of approximately 6%, it may be possible to effectively prevent the warpage of the package substrate 50 during the flip chip bonding process. For example, even though the first residual rate of the first circuit patterns 51 is approximately 60% and the second residual rate of the second circuit patterns 53 is approximately 66%, the warpage of the package substrate 50 may be effectively suppressed during the flip chip bonding process.

In an embodiment, the first residual rate and the second residual rate of each of package substrates may be monitored to obtain an allowable residual rate difference value between the first residual rate and the second residual rate for each package substrate, and the package substrates having the allowable residual rate difference value of 6% or less may be selectively used as the package substrate 50. Since the selected package substrates have the allowable residual rate difference value of 6% or less, occurrences of the electrical connection failure between the second inner connectors 33 and the second circuit patterns 13B, which is described with reference to FIG. 1, may substantially decrease during or after the flip chip bonding process if the selected package substrates are used as the package substrate 50.

In order to select the package substrates having the allowable residual rate difference value, it may be necessary to initially monitor the first residual rate of the first circuit patterns 51 and the second residual rate of the second circuit patterns 53. In order to monitor the first residual rate and the second residual rate, monitoring patterns, indicating the first residual rate of the first circuit patterns 51 and the second residual rate of the second circuit patterns 53, may be formed on the package substrate 50. Each of the monitoring patterns may be designed to constitute a pattern group, including sub-patterns that are etched and removed, one by one, whenever one of the first and second residual rates of the first and second circuit patterns 51 and 53 is reduced by a predetermined unit value. The monitoring patterns may be designed such that the number of the sub-patterns remaining on the package substrate 50 indicates residual rates of the first and second circuit patterns 51 and 53.

The word "predetermined" as used herein with respect to a parameter, such as a predetermined value, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

Figure 3:
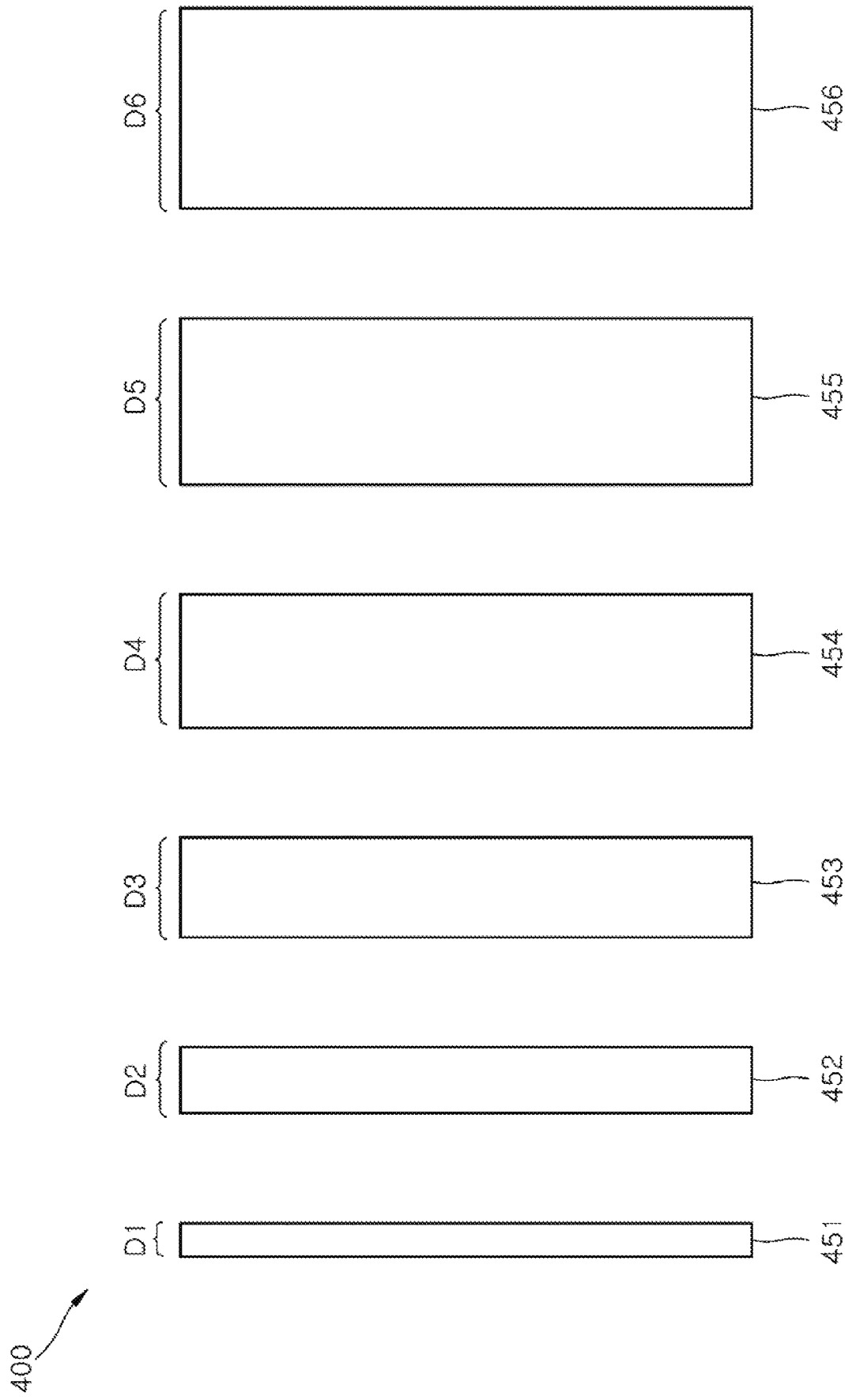
FIG. 3 is a plan view illustrating a layout of a monitoring pattern employed in a semiconductor package according to an embodiment.

FIG. 3 is a plan view illustrating a layout of a monitoring pattern 400 employed in a semiconductor package according to an embodiment.

As illustrated in FIG. 3, the monitoring pattern 400 may include sub-patterns 451, 452, 453, 454, 455 and 456 which have different widths from each other. The sub-patterns 451, 452, 453, 454, 455 and 456 may be designed to indicate a residual rate of circuit patterns (the first circuit patterns 51 or the second circuit patterns 53 of FIG. 2). The sub-patterns 451, 452, 453, 454, 455 and 456 may be sequentially removed, one by one, whenever the residual rate of the first circuit patterns 51 or second circuit pattern 53 is reduced by a predetermined unit value.

The sub-patterns 451, 452, 453, 454, 455 and 456 may be designed to have different widths from each other. The sub-patterns 451, 452, 453, 454, 455 and 456 may be designed to be line-shaped patterns which are disposed side by side and spaced apart from each other. The patterns 451, 452, 453, 454, 455 and 456 may be designed to have different widths from each other in order to be sequentially lost, one by one, according to a decrease amount of the residual rate of the first circuit patterns 51 or second circuit pattern 53. If the sub-patterns 451, 452, 453, 454, 455 and 456 are respectively referred to as first to sixth sub-patterns, the first to sixth sub-patterns 451, 452, 453, 454, 455 and 456 may be sequentially arrayed in one direction and the N$^{th}$ sub-pattern may be designed to have a width corresponding to 'N' times a width of the first sub-pattern 451 (where, 'N' denote a natural number which is equal to or greater than two).

The first sub-pattern 451 may have a first width D1 corresponding to a minimum width among widths of the first to sixth sub-patterns 451, 452, 453, 454, 455 and 456. The second to sixth sub-patterns 452, 453, 454, 455 and 456 may be designed to respectively have second to sixth widths D2, D3, D4, D5 and D6 corresponding to multiples of the first width D1 of the first sub-pattern 451. For example, the N$^{th}$ sub-pattern may be designed to have a width corresponding to 'N' times the first width D1 of the first sub-pattern 451. That is, the second width D2 may be twice the first width D1, the third width D3 may be three times the first width D1, the fourth width D4 may be four times the first width D1, the fifth width D5 may be five times the first width D1, and the sixth width D6 may be six times the first width D1.

If the first residual rate of the first circuit patterns 51 is reduced by 1%, corresponding to a predetermined unit value, an etch rate of the first circuit patterns 51 and the monitoring pattern 400 may increase by approximately 1%. If a width of the first circuit patterns 51 is reduced by approximately 1 micrometer, when the etch rate of the first circuit patterns 51 increases by approximately 1%, the first width D1 of the first sub-pattern 451 may be set as 1 micrometer to indicate a decrease amount of the first residual rate of 1%. In such a case, the second to sixth widths D2, D3, D4, D5 and D6 may be set to be 2 micrometers, 3 micrometers, 4 micrometers, 5 micrometers and 6 micrometers, respectively.

Since the first to sixth sub-patterns 451, 452, 453, 454, 455 and 456 are designed to have the first to sixth widths D1, D2, D3, D4, D5 and D6 which sequentially increase by a predetermined value, the first to sixth sub-patterns 451, 452, 453, 454, 455 and 456 may be sequentially removed, one by one, whenever the residual rate of the first circuit patterns 51 or second circuit pattern 53 is reduced by a predetermined rate, corresponding to the predetermined value during an etch process for forming the first circuit patterns 51 or second circuit pattern 53. Thus, the residual rate of the first circuit patterns 51 or second circuit patterns 53 or a decrease amount of the residual rate of the first circuit patterns 51 or second circuit patterns 53 may be extracted from the number of the remaining sub-patterns among the first to sixth sub-patterns 451, 452, 453, 454, 455 and 456 after the etch process for forming the first circuit patterns 51 or second circuit pattern 53. The actual residual rate of the first circuit patterns 51 or second circuit pattern 53 formed on the package substrate 50 may be calculated by subtracting the decrease amount of the residual rate of the first circuit patterns 51 or second circuit pattern 53 from the designed residual rate of the first circuit patterns 51 or second circuit pattern 53. Thus, the number of sub-patterns remaining on the package substrate 50 may have direct relation to the residual rate of the first circuit patterns 51 or second circuit pattern 53 formed on the package substrate 50.

In an embodiment, the first width D1 of the first sub-pattern 451 may be set such that the first sub-pattern 451 is etched and removed when the residual rate of the first circuit patterns 51 or second circuit patterns 53 is reduced by 1%. In addition, the second width D2 of the second sub-pattern 452 may be set such that the second sub-pattern 452 is etched and removed when the residual rate of the first circuit patterns 51 or second circuit patterns 53 is reduced by 2%, the third width D3 of the third sub-pattern 453 may be set such that the third sub-pattern 453 is etched and removed when the residual rate of the first circuit patterns 51 or second circuit patterns 53 is reduced by 3%, the fourth width D4 of the fourth sub-pattern 454 may be set such that the fourth sub-pattern 454 is etched and removed when the residual rate of the first circuit patterns 51 or second circuit patterns 53 is reduced by 4%, the fifth width D5 of the fifth sub-pattern 455 may be set such that the fifth sub-pattern 455 is etched and removed when the residual rate of the first circuit patterns 51 or second circuit patterns 53 is reduced by 5%, and the sixth width D6 of the sixth sub-pattern 456 may be set such that the sixth sub-pattern 456 is etched and removed when the residual rate of the first circuit patterns 51 or second circuit patterns 53 is reduced by 6%.

It may be assumed that the first circuit patterns (51 of FIG. 2) are designed to have the first residual rate of 66% with respect to the first surface (57 of FIG. 2) at a design step. In such a case, if the first sub-pattern 451 of the monitoring pattern 400 is removed and second to sixth sub-patterns 452 to 456 of the monitoring pattern 400 are left after an etch process for forming the first circuit patterns (51 of FIG. 2) is performed, an actual value of the first residual rate of the first circuit patterns (51 of FIG. 2) may be evaluated as 65%. Since the first sub-pattern 451 is designed to be etched and removed when the residual rate of the first circuit patterns 51 or second circuit pattern 53 is reduced by 1%, the actual residual rate of the first circuit patterns 51 or second circuit pattern 53 may be regarded as being reduced by 1% from the designed residual rate if only the first sub-pattern 451 is removed after the etch process for forming the first circuit patterns 51 or second circuit patterns 53.

As described above, the actual residual rate of the first circuit patterns 51 or second circuit pattern 53 may be obtained by monitoring the number of the sub-patterns remaining in the monitoring pattern 400, after formation of the package substrate 50.

FIGS. 4 to 9 are cross-sectional views illustrating a method of fabricating a semiconductor package according to an embodiment.

Figure 4:
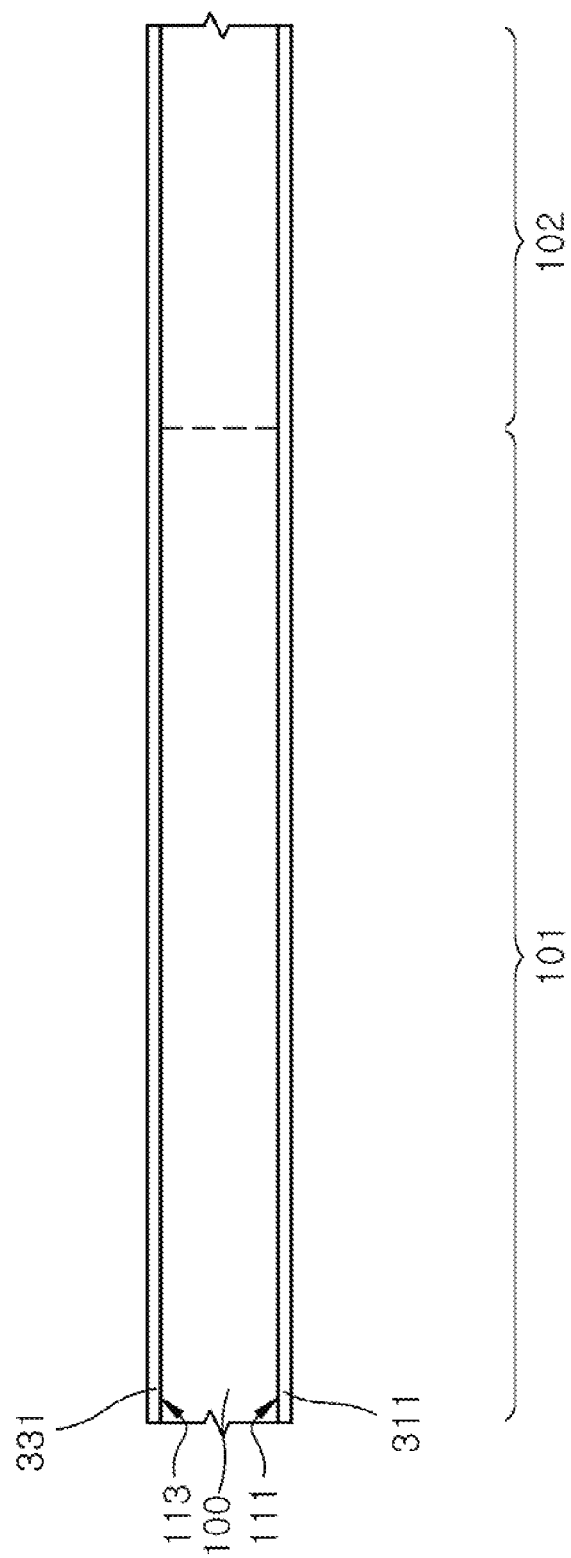
FIGS. 4 to 9 are cross-sectional views illustrating a method of fabricating a semiconductor package according to an embodiment.

Referring to FIG. 4, a substrate body 100 having a first surface 111 and a second surface 113, which are opposite of each other, may be provided. A first seed layer 311 may be formed on the first surface 111 of the substrate body 100, and a second seed layer 331 may be formed on the second surface 113 of the substrate body 100. The first seed layer 311 and the second seed layer 331 may be conductive seed layers that are used to grow plating layers during a subsequent plating process. The substrate body 100 may be provided to include a dielectric layer, and the first and second seed layers 311 and 331 may be formed of a conductive layer, including a copper material. The first seed layer 311, the substrate body 100 and the second seed layer 331 may constitute a copper clad laminate (CCL) structure. The substrate body 100 may include a resin layer, and each of the first and second seed layers 311 and 331 may include a copper foil, laminated on a surface of the resin layer.

The substrate body 100 may be divided into a first region 101 and a second region 102. The first region 101 may be a region on which the circuit patterns (corresponding to the first and second circuit patterns 51 and 53 of FIG. 2) are disposed, and the second region 102 may be a peripheral region surrounding side surfaces of the first region 101. The first region 101 may be a region overlapping with the semiconductor chip 60 of FIG. 2. The second region 102 may be a region (e.g., a scribe lane) on which no circuit patterns are disposed.

Figure 5:
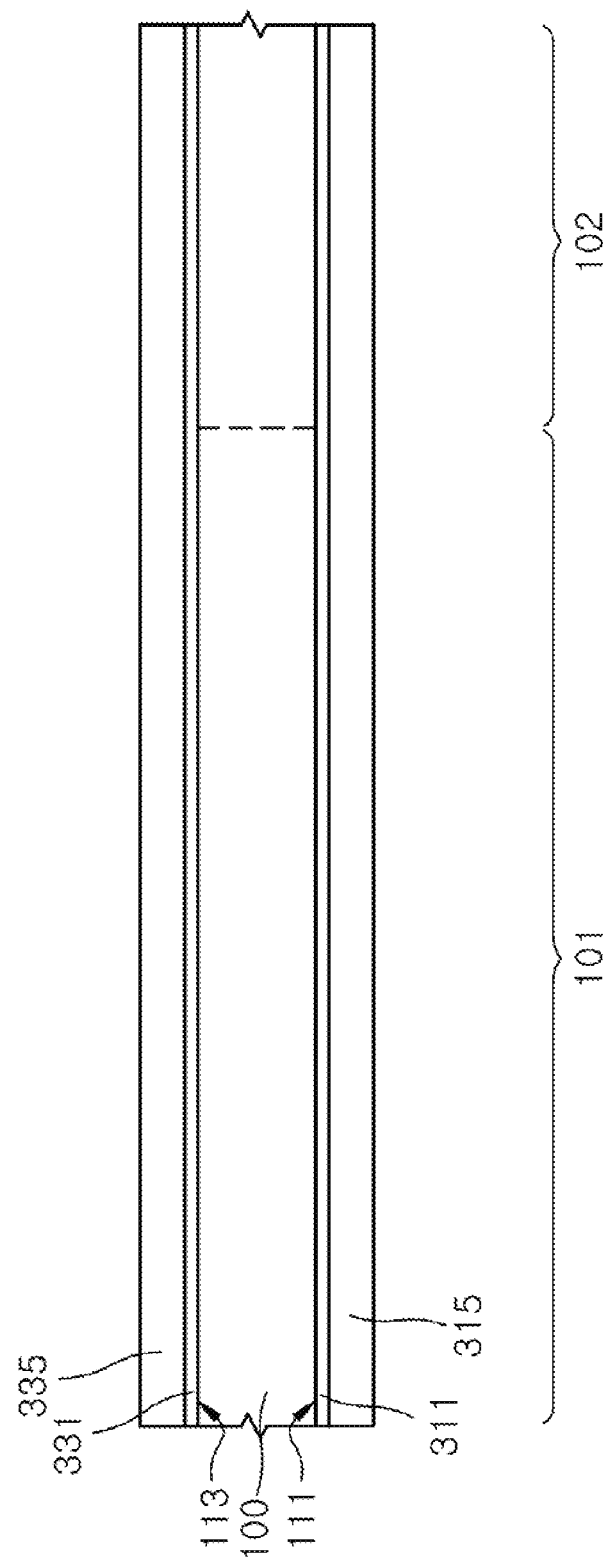

Referring to FIG. 5, a first plating layer 315 may be formed on the first seed layer 311. A second plating layer 335 may be formed on the second seed layer 331. The first plating layer 315 may be formed by growing a copper material using a plating process. The second plating layer 335 may be formed by growing a copper material using a plating process. The first and second plating layers 315 and 335 may be simultaneously formed using a single plating process. Via holes (not shown), penetrating all of the first seed layer 311, the substrate body 100 and the second seed layer 331, may be additionally formed before the first and second plating layers 315 and 335 are formed.

Figure 6:
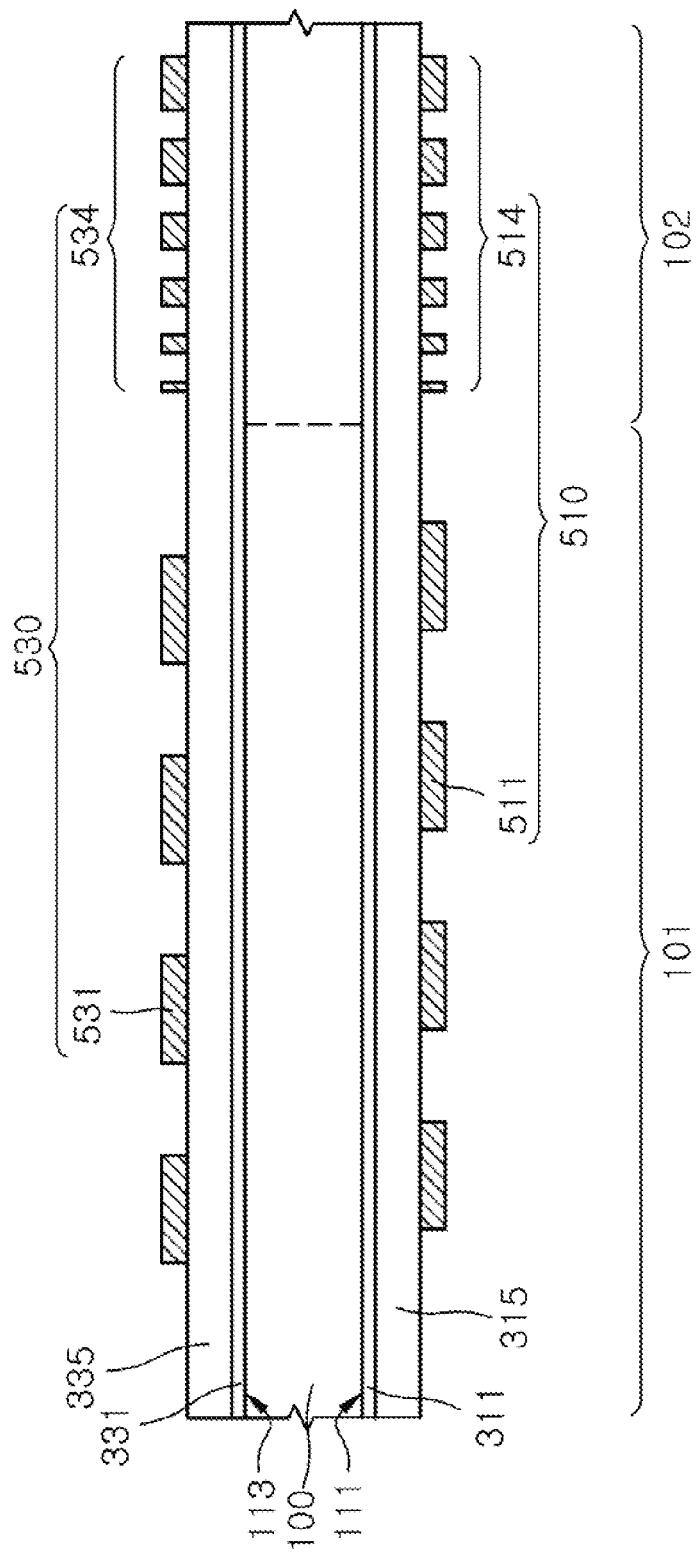

Referring to FIG. 6, a first resist pattern 510 may be formed on the first plating layer 315. A second resist pattern 530 may be formed on the second plating layer 335. The first resist pattern 510 may be used as an etch mask during an etch process for patterning the first plating layer 315, and the second resist pattern 530 may be used as an etch mask during an etch process for patterning the second plating layer 335. Each of the first and second resist patterns 510 and 530 may be formed to include a photoresist layer. The first resist pattern 510 may be formed by forming a dry film on the first plating layer 315 and by patterning the dry film, using a photolithography process including an exposure step and a development step. The second resist pattern 530 may also be formed by forming a dry film on the second plating layer 335 and by patterning the dry film, using a photolithography process including an exposure step and a development step.

The first resist pattern 510 may be formed to include first circuit resist patterns 511, located on the first region 101 of the substrate body 100. The first circuit resist patterns 511 may be formed to have substantially the same planar shapes as the first circuit patterns (51 of FIG. 2). In addition, the first resist pattern 510 may be formed to include first monitoring resist patterns 514, located on the second region 102 of the substrate body 100. Image of the monitoring pattern 400, illustrated in FIG. 3, may be transferred onto the second region 102 of the substrate body 100 to form the first monitoring resist patterns 514. That is, the first monitoring resist patterns 514 may be formed to have substantially the same planar shape as the monitoring pattern 400.

The second resist pattern 530 may be formed to include second circuit resist patterns 531, located on the first region 101 of the substrate body 100. The second circuit resist patterns 531 may be formed to have substantially the same planar shapes as the second circuit patterns (53 of FIG. 2). In addition, the second resist pattern 530 may be formed to include second monitoring resist patterns 534, located on the second region 102 of the substrate body 100. Image of the monitoring pattern 400, illustrated in FIG. 3, may be transferred onto the second region 102 of the substrate body 100 to form the second monitoring resist patterns 534. That is, the second monitoring resist patterns 534 may be formed to have substantially the same planar shape as the monitoring pattern 400.

The second monitoring resist patterns 534 may be formed to vertically overlap with the first monitoring resist patterns 514. The second monitoring resist patterns 534 may be formed to have substantially the same planar shapes as the first monitoring resist patterns 514.

Figure 7:
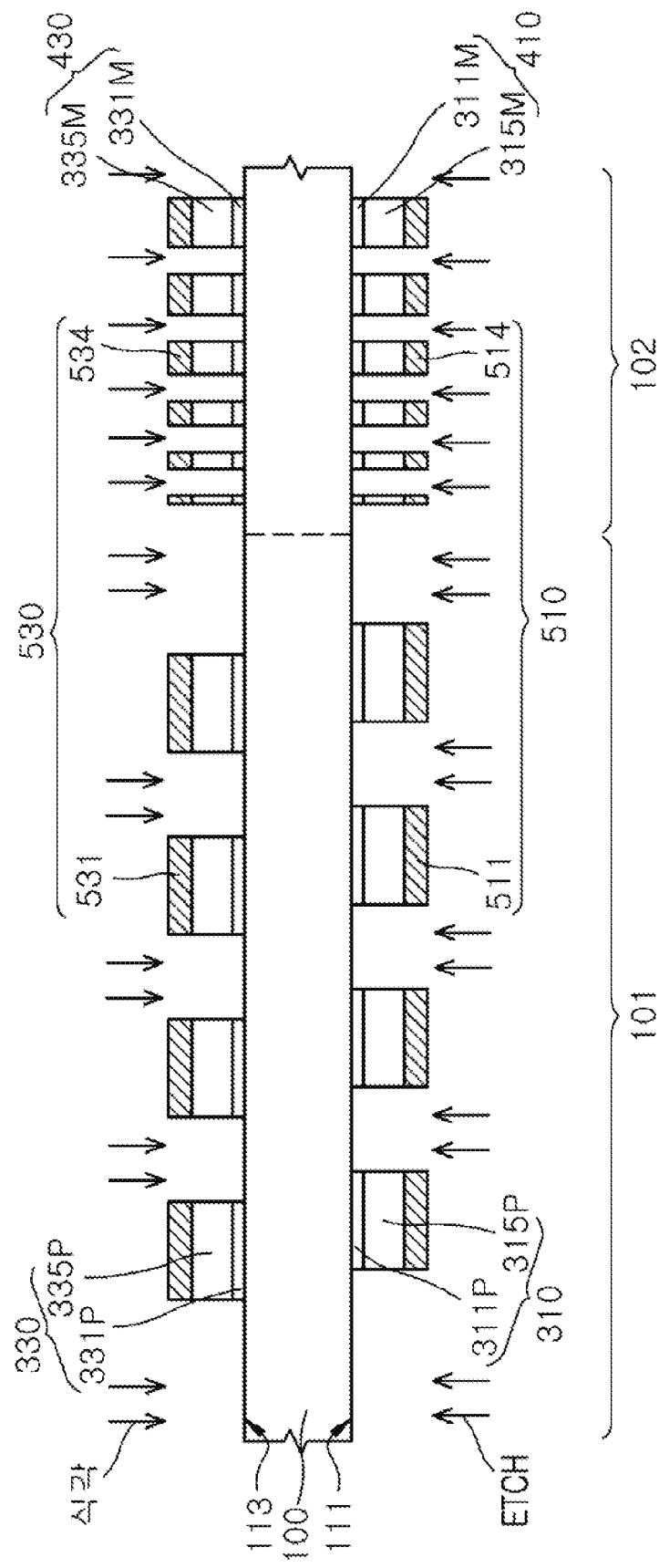

Referring to FIG. 7, the first plating layer (315 of FIG. 6) may be etched, using the first resist pattern 510 as an etch mask until portions of the first seed layer (311 of FIG. 6) are exposed. The first seed layer (311 of FIG. 6) may also be etched to expose portions of the substrate body 100 while the first plating layer (315 of FIG. 6) is etched. As a result, first circuit patterns 310 and a first monitoring pattern 410 may be formed on the first and second regions 101 and 102 of the substrate body 100, respectively. Each of the first circuit patterns 310 may be formed to include a first circuit seed layer pattern 311P and a first circuit plating layer pattern 315P, which are sequentially stacked on the first surface 111 of the substrate body 100. Each of monitoring sub-patterns constituting the first monitoring pattern 410 may be formed to include a first monitoring seed layer pattern 311M and a first monitoring plating layer pattern 315M, which are sequentially stacked on the first surface 111 of the substrate body 100.

The second plating layer (335 of FIG. 6) may be etched using the second resist pattern 530 as an etch mask until portions of the second seed layer (331 of FIG. 6) are exposed. The second seed layer (331 of FIG. 6) may also be etched to expose portions of the substrate body 100 while the second plating layer (335 of FIG. 6) is etched. As a result, second circuit patterns 330 and a second monitoring pattern 430 may be formed on the first and second regions 101 and 102 of the substrate body 100, respectively. Each of the second circuit patterns 330 may be formed to include a second circuit seed layer pattern 331P and a second circuit plating layer pattern 335P which are sequentially stacked on the second surface 113 of the substrate body 100. Each of monitoring sub-patterns constituting the second monitoring pattern 430 may be formed to include a second monitoring seed layer pattern 331M and a second monitoring plating layer pattern 335M which are sequentially stacked on the second surface 113 of the substrate body 100.

The first and second resist patterns 510 and 530 may be removed after the first and second circuit patterns 310 and 330 and the first and second monitoring patterns 410 and 430 are formed.

Figure 8:
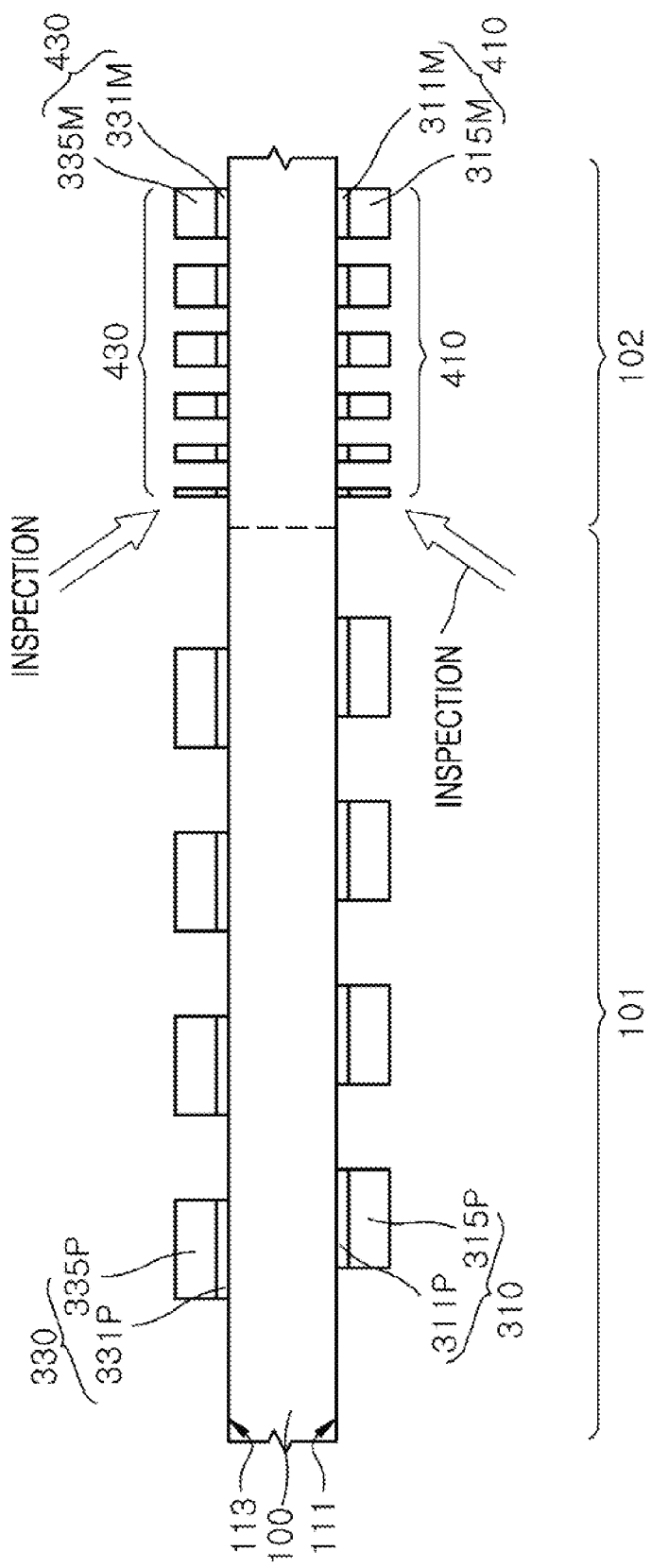

Referring to FIG. 8, the first monitoring pattern 410, formed on the first surface 111 of the second region 102 of the substrate body 100, may be visually inspected to find out a first residual rate of the first circuit patterns 310. Similarly, the second monitoring pattern 430, formed on the second surface 113 of the second region 102 of the substrate body 100, may be visually inspected to find out a second residual rate of the second circuit patterns 330.

If the first residual rate is substantially equal to the second residual rate, the first and second circuit patterns 310 and 330 may be regarded as being normally and accurately formed on the substrate body 100. If a difference between the first residual rate and the second residual rate is within an allowable range, for example, within the range of approximately 6%, the first and second circuit patterns 310 and 330 may be regarded as being normally formed on the substrate body 100. In order to more strictly classify the package substrate, including the first and second circuit patterns 310 and 330, the allowable range of the difference between the first residual rate and the second residual rate may be reduced. For example, if a difference between the first residual rate and the second residual rate is within the range of 4%, the first and second circuit patterns 310 and 330 may be regarded as being normally formed on the substrate body 100. If the difference between the first residual rate and the second residual rate is out of the allowable range, the first and second circuit patterns 310 and 330 may be regarded as being abnormally formed on the substrate body 100.

After the first and second monitoring patterns 410 and 430 are inspected to find out the first and second residual rates, the substrate body 100 on which the first and second circuit patterns 310 and 330 are formed may be divided into a good substrate or a failed substrate based on the difference between the first residual rate and the second residual rate.

If the substrate body 100, on which the first and second circuit patterns 310 and 330 are formed, is classified as the failed substrate, the substrate body 100 on which the first and second circuit patterns 310 and 330 are formed may be disused. On the other hand, if the substrate body 100, on which the first and second circuit patterns 310 and 330 are formed, is classified as the good substrate, a subsequent package process may be applied to the substrate body 100 on which the first and second circuit patterns 310 and 330 are formed.

Figure 9:
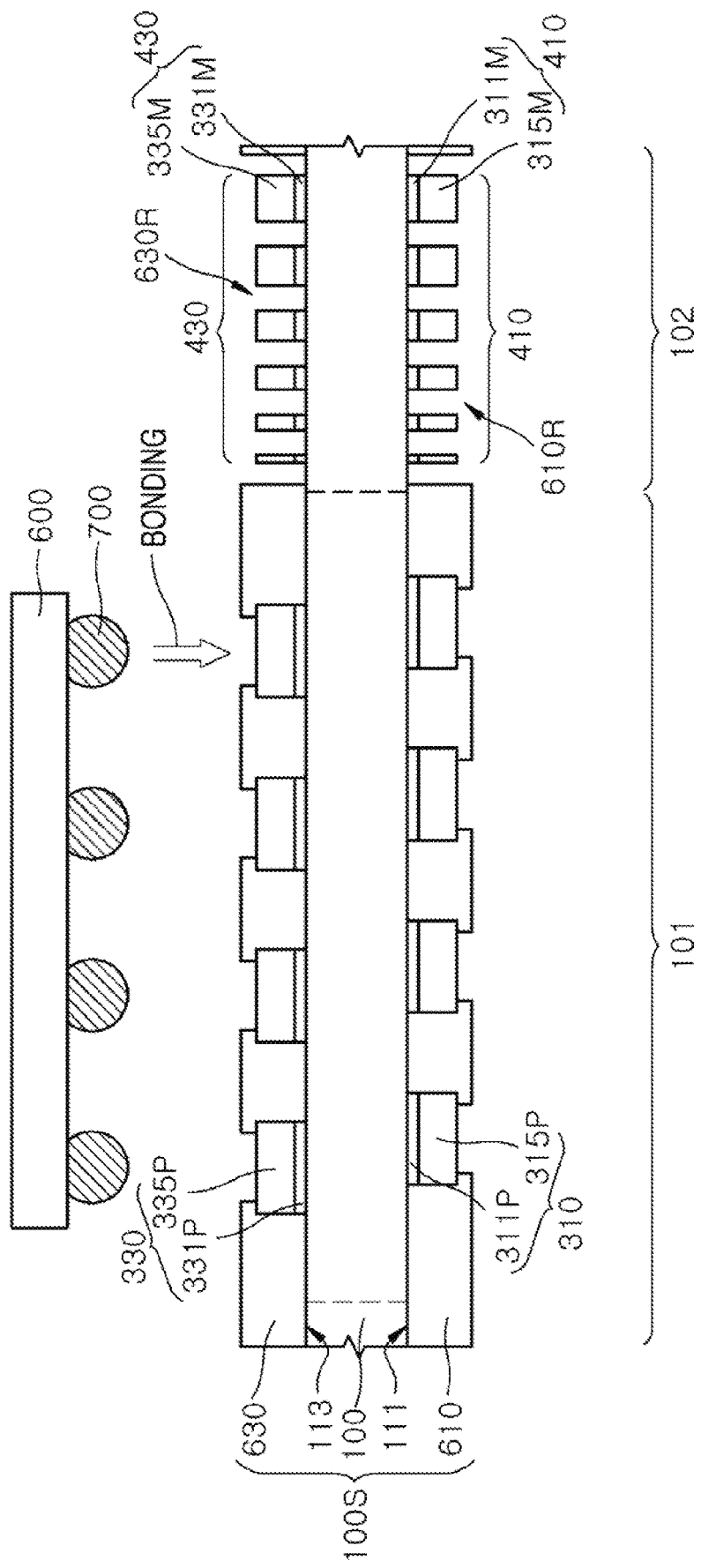

Referring to FIG. 9, if the substrate body 100, on which the first and second circuit patterns 310 and 330 are formed, is classified as the good substrate, a first dielectric layer 610 may be formed on the first surface 111 of the substrate body 100 to expose the first circuit patterns 310. In addition, a second dielectric layer 630 may be formed on the second surface 113 of the substrate body 100 to expose the second circuit patterns 330. The first dielectric layer 610 may be formed to provide a first dielectric opening 610R that has a hole shape to expose the first monitoring pattern 410. The second dielectric layer 630 may be formed to provide a second dielectric opening 630R that has a hole shape to expose the second monitoring pattern 430. The first and second dielectric layers 610 and 630 may be formed to include a solder resist layer. The substrate body 100, the first and second circuit patterns 310 and 330, the first and second monitoring patterns 410 and 430, and the first and second dielectric layers 610 and 630 may constitute a package substrate 100S.

A semiconductor chip 600 may be bonded to the package substrate 100S in a flip chip form. Specifically, inner connectors 700, attached to the semiconductor chip 600, may be bonded to the second circuit patterns 330 of the package substrate 100S. As described above, the difference between the first residual rate of the first circuit patterns 310 and the second residual rate of the second circuit patterns 330 is within the allowable range. Thus, during a flip chip bonding process, for bonding the semiconductor chip 600 to the package substrate 100S, the warpage of the package substrate 100S may be effectively suppressed, preventing electrical connection failure between the inner connectors 700 attached to the semiconductor chip 600 and the second circuit patterns 330 of the package substrate 100S. The inner connectors 700 may include conductive bumps.

Since the first and second monitoring patterns 410 and 430 are exposed by the first and second dielectric openings 610R and 630R, the first and second monitoring patterns 410 and 430 may be readily monitored, even after the semiconductor chip 600 is bonded to the package substrate 100S.

Figure 10:
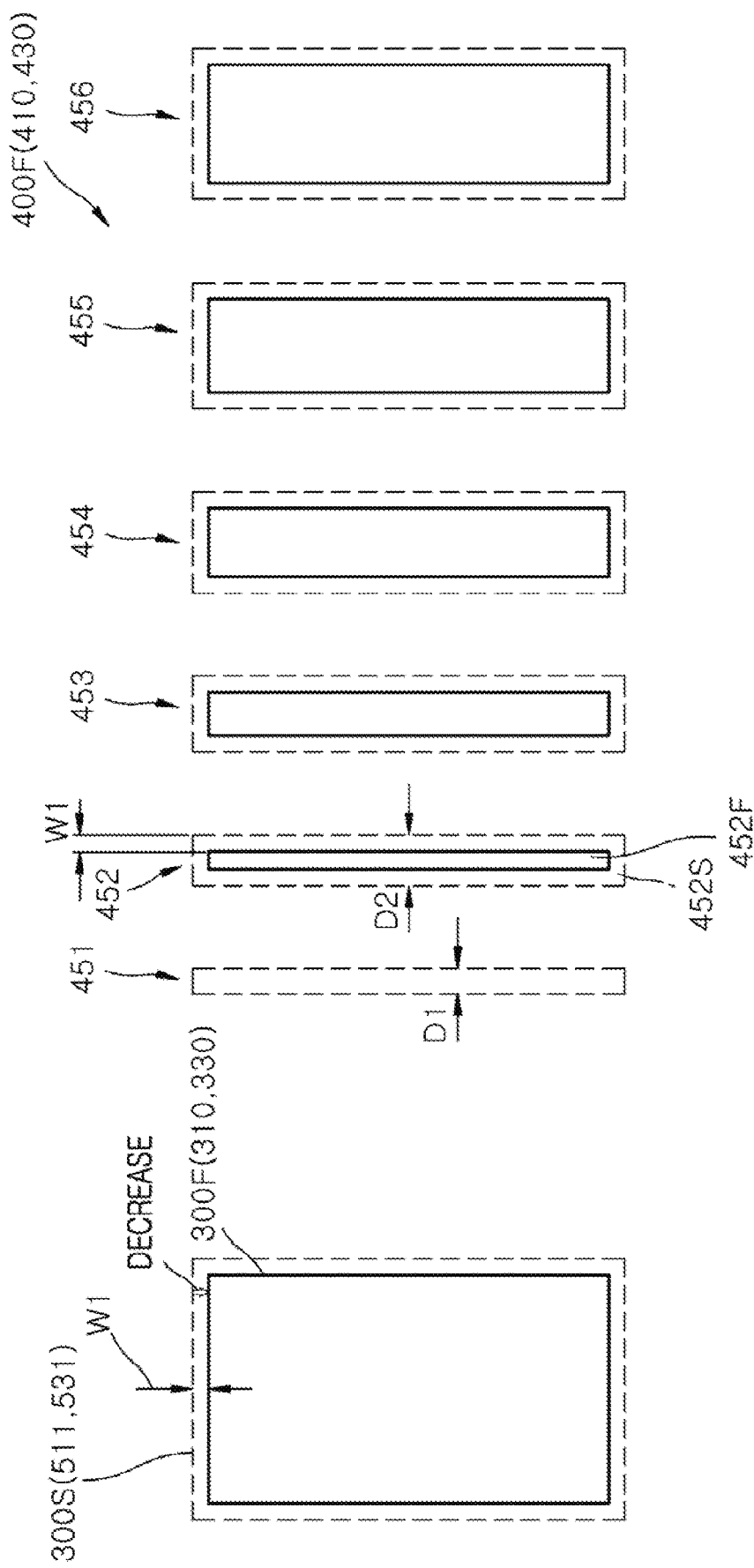
FIGS. 10 to 12 are plan views illustrating shapes of remaining patterns of a monitoring pattern employed in a semiconductor package according to an embodiment.
Figure 11:
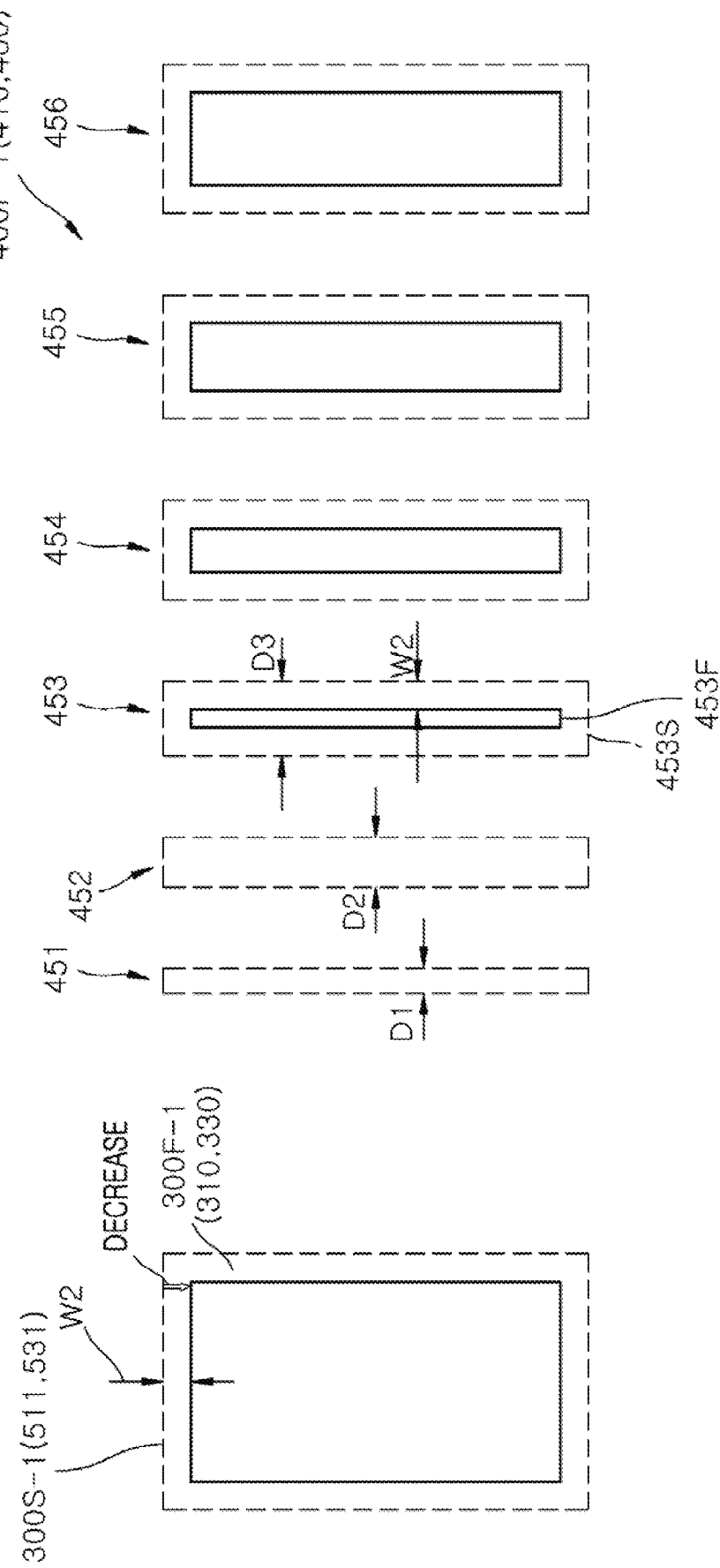

FIGS. 10 and 11 are plan views illustrating a partial loss phenomenon of monitoring patterns 400F and 400E-1 employed in a semiconductor package according to an embodiment.

Referring to FIG. 10, an arbitrary pattern 300F of the remaining circuit patterns 310 or circuit pattern 330, after the etch processes for forming the circuit patterns 310 or circuit pattern 330 are performed, may be shrunk by a certain width W1, per each side in a plan view, as compared with a designed layout 300S. During the etch processes described with reference to FIG. 7, the etch rates of the plating layers 315 and 335 and the seed layers 311 and 331 may change according to variation of the etch environment. In consideration of the variation of the etch rates of the plating layers 315 and 335 and the seed layers 311 and 331, the circuit patterns 310 or circuit pattern 330 may be formed using an over-etch process. In such a case, the arbitrary pattern 300F may be formed to have a reduced size as compared with the designed layout 300S of the arbitrary pattern 300F.

The first monitoring pattern 410 may be formed as the first circuit patterns 310 are being formed, and second monitoring pattern 430 may be formed as the second circuit patterns 330 are being formed. Thus, if the arbitrary pattern 300F is formed to have a size which is less than a size of the designed layout 300S of the arbitrary pattern 300F, the monitoring pattern 400F may also be formed to be shrunk as compared with a designed layout of the monitoring pattern 400F. In such a case, at least one of the sub-patterns 451, 452, 453, 454, 455 and 456 constituting the monitoring pattern 400F may be fully etched and removed after the etch process for forming the arbitrary pattern 300F.

In an embodiment, it may be assumed that the circuit patterns 310 or circuit pattern 330 are formed to be over-etched by the certain width W1 per each side in a plan view as compared with the designed layout 300S. In such a case, if the first width D1 corresponding to a width of the first sub-pattern 451 is designed to be less than twice the certain width W1, the first sub-pattern 451 may be removed by the etch process for forming the circuit patterns 310 or circuit pattern 330. If the second width D2 corresponding to a width of the second sub-pattern 452 is designed to be greater than twice the certain width W1, the second sub-pattern 452 may remain even though the etch process for forming the circuit patterns 310 or circuit pattern 330 is performed. A remaining pattern 452F of the second sub-pattern 452 may have a width that is reduced by twice the certain width W1 from the second width D2 corresponding to a width of a designed layout 452S of the second sub-pattern 452. Since the third to sixth sub-patterns 453, 454, 455 and 456 are designed to have widths which are greater than the second width D2, the third to sixth sub-patterns 453, 454, 455 and 456 may remain even after the etch process for forming the circuit patterns 310 or circuit pattern 330 is performed.

The loss of the first sub-pattern 451, after the etch process for forming the circuit patterns 310 or circuit pattern 330, may indicate increase of the etch rate of the circuit patterns 310 or circuit pattern 330. The increase of the etch rate of the circuit patterns 310 or circuit pattern 330 means that a residual rate of the circuit patterns 310 or circuit pattern 330 is reduced. Thus, the loss of only the first sub-pattern 451 after forming the circuit patterns 310 or circuit pattern 330 may mean that the residual rate of the circuit patterns 310 or circuit pattern 330 is reduced by a predetermined unit value.

Referring to FIG. 11, an arbitrary pattern 300E-1 of the circuit patterns 310 or circuit pattern 330 remaining after the etch processes for forming the circuit patterns 310 or circuit pattern 330 are performed may be shrunk by a certain width W2 per each side in a plan view as compared with a designed layout 300S-1. If the arbitrary pattern 300E-1 is formed to have a size which is less than a size of the designed layout 300S-1 of the arbitrary pattern 300E-1, the monitoring pattern 400E-1 may also be formed to be shrunk as compared with a designed layout of the monitoring pattern 400E-1. In such a case, all of the sub-patterns 451~456 constituting the monitoring pattern 400E-1 may be formed to be shrunk by the certain width W2 per each side in a plan view.

if the first width D1 corresponding to a width of the first sub-pattern 451 and the second width D2 corresponding to a width of the second sub-pattern 452 are designed to be less than twice the certain width W2, the first and second sub-patterns 451 and 452 may be removed by the etch process for forming the circuit patterns 310 or circuit pattern 330. If the third width D3 corresponding to a width of the third sub-pattern 453 is designed to be greater than twice the certain width W2, the third sub-pattern 453 may remain even though the etch process for forming the circuit patterns 310 or circuit pattern 330 is performed. A remaining pattern 453F of the third sub-pattern 453 may have a width that is reduced by twice the certain width W2 from the third width D3 corresponding to a width of a designed layout 453S of the third sub-pattern 453. Since the fourth to sixth sub-patterns 454, 455 and 456 are designed to have widths which are greater than the third width D3, the fourth to sixth sub-patterns 454, 455 and 456 may remain even after the etch process for forming the circuit patterns 310 or circuit pattern 330 is performed.

The loss of the first and second sub-patterns 451 and 452, after the etch process for forming the circuit patterns 310 or circuit pattern 330, may indicate increase of the etch rate of the circuit patterns 310 or circuit pattern 330 and reduction of the residual rate of the circuit patterns 310 or circuit pattern 330.

As described above, since the monitoring pattern 400F or 400E-1 indicates the residual rate of the circuit patterns 310 or circuit pattern 330, the residual rate of the circuit patterns 310 or circuit pattern 330 may be monitored by inspecting the monitoring pattern 400F or 400E-1.

Figure 12:
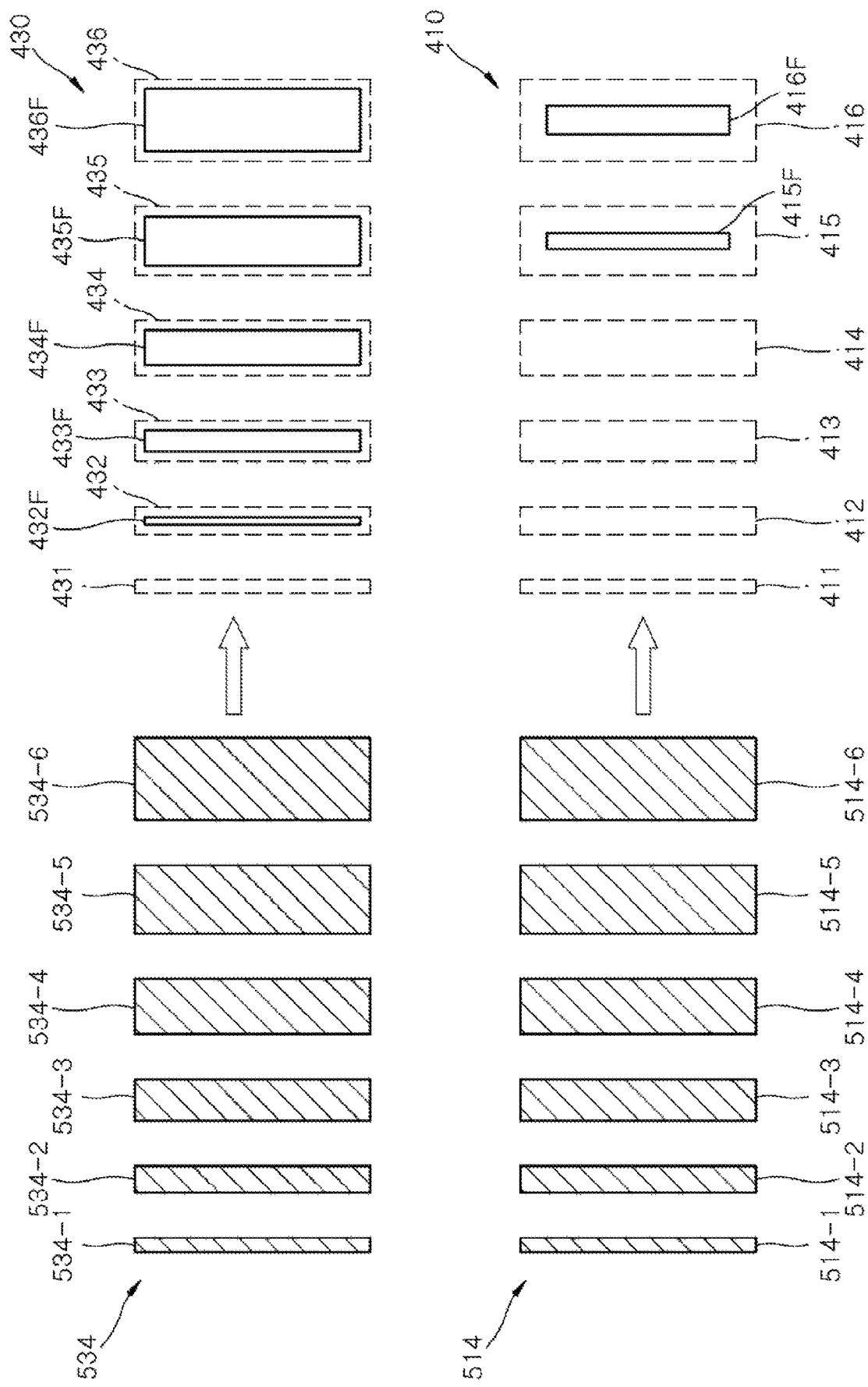
Figure 13:
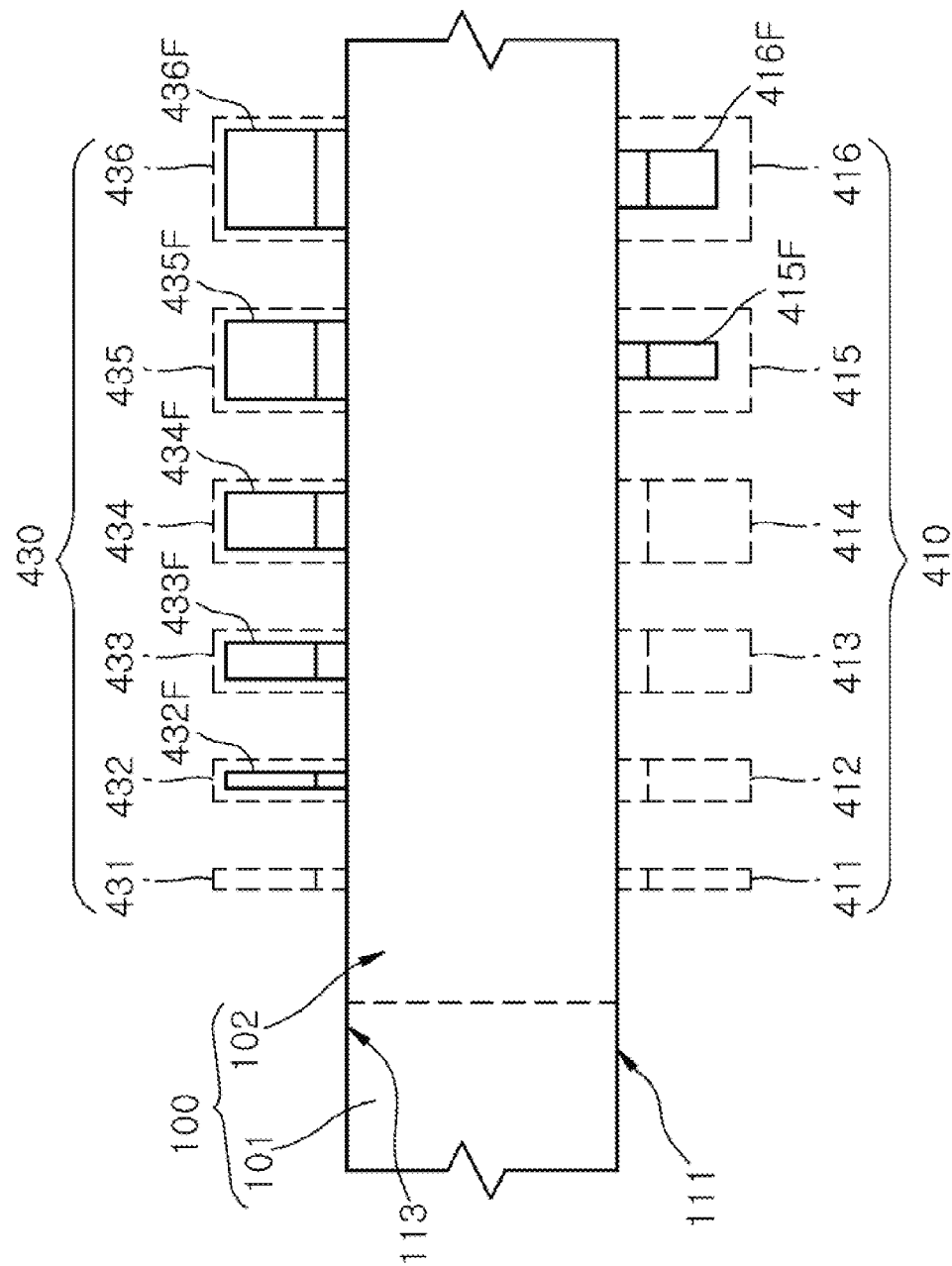
FIG. 13 is a cross-sectional view illustrating shapes of remaining patterns of a monitoring pattern employed in a semiconductor package according to an embodiment.

FIG. 12 is a plan view illustrating remaining sub-patterns of the first and second monitoring patterns 410 and 430 employed in a semiconductor package according to an embodiment. FIG. 13 is a cross-sectional view illustrating remaining sub-patterns of the first and second monitoring patterns 410 and 430 employed in a semiconductor package according to an embodiment.

Referring to FIGS. 12 and 13, the first monitoring resist patterns 514 may have the same planar shape as the monitoring pattern 400 illustrated in FIG. 3. The first monitoring resist patterns 514 may include first to sixth sub-patterns 514-1, 514-2, 514-3, 514-4, 514-5, 514-5 and 514-6. The first monitoring pattern 410 may be formed using an etch process that employs the first monitoring resist patterns 514 as etch masks. If the etch process is ideally performed, all of first to sixth sub-patterns 411, 412, 413, 414, 415 and 416 included in the first monitoring pattern 410 may be formed to have the same shapes as the first to sixth sub-patterns 514-1, 514-2, 514-3, 514-4, 514-5, 514-5 and 514-6 of the first monitoring resist patterns 514.

For example, if the etch rate excessively increases during the etch process for forming the first monitoring pattern 410, the first to fourth sub-patterns 411, 412, 413 and 414 of the first monitoring pattern 410 may be removed and only the fifth and sixth sub-patterns 415 and 416 may remain on the first surface 111 of the substrate body 100 after the etch process is performed. The first sub-pattern 411 may be designed to have a width corresponding to 1% of the first residual rate of the first circuit patterns (310 of FIG. 7), and the $N^{th}$ sub-pattern may be designed to have a width corresponding to 'N' times a width of the first sub-pattern 411, as described with reference to FIG. 3. In such a case, if only patterns 415F and 416F of the fifth and sixth sub-patterns 415 and 416 remain on the first surface 111 of the substrate body 100 after the etch process is performed, the first residual rate of the first circuit patterns (310 of FIG. 7) may be regarded as being reduced by 4% from a first reference residual rate determined by the designed layout.

The second monitoring resist patterns 534 may also have the same planar shape as the monitoring pattern 400 illustrated in FIG. 3. The second monitoring resist patterns 534 may include first to sixth sub-patterns 534-1, 534-2, 534-3, 534-4, 534-5 and 534-6. The second monitoring pattern 430 may be formed using an etch process that employs the second monitoring resist patterns 534 as etch masks. If the etch process is ideally performed, all of first to sixth sub-patterns 431, 432, 433, 434, 435 and 436 included in the second monitoring pattern 430 may be formed to have the same shapes as the first to sixth sub-patterns 534-1, 534-2, 534-3, 534-4, 534-5 and 534-6 of the second monitoring resist patterns 534.

For example, if the etch rate increases during the etch process for forming the second monitoring pattern 430, only the first sub-pattern 431 of the second monitoring pattern 430 may be removed and remaining patterns 432F, 433F, 434F, 435F and 436F of the second to sixth sub-patterns 432, 433, 434, 435 and 436 may remain on the second surface 113 of the substrate body 100 after the etch process is performed. If the remaining patterns 432F, 433F, 434F, 435F and 436F of the second to sixth sub-patterns 432, 433, 434, 435 and 436 remain on the second surface 113 of the substrate body 100 after the etch process is performed, the second residual rate of the second circuit patterns (330 of FIG. 7) may be regarded as being reduced by 1% from a second reference residual rate (substantially equals to the first reference residual rate) determined by the designed layout.

As described above, the remaining sub-patterns of the first and second monitoring patterns 410 and 430 may be inspected to monitor and obtain an actual residual rate of the first circuit patterns 310 and an actual residual rate of the second circuit patterns 330. Thus, a difference between the actual residual rate of the first circuit patterns 310 and the actual residual rate of the second circuit patterns 330 may be calculated to classify a package substrate including the first and second circuit patterns 310 and 330 as either a good package substrate or a failed package substrate.

The embodiment illustrated in FIGS. 4 to 9 describes a method of fabricating a semiconductor package with a tenting technique. Alternatively, a modified semi-additive process (MSAP) technique may be applied to a method of fabricating a semiconductor package according to another embodiment.

FIGS. 14 to 21 are cross-sectional views illustrating a method of fabricating a semiconductor package according to another embodiment.

Figure 14:
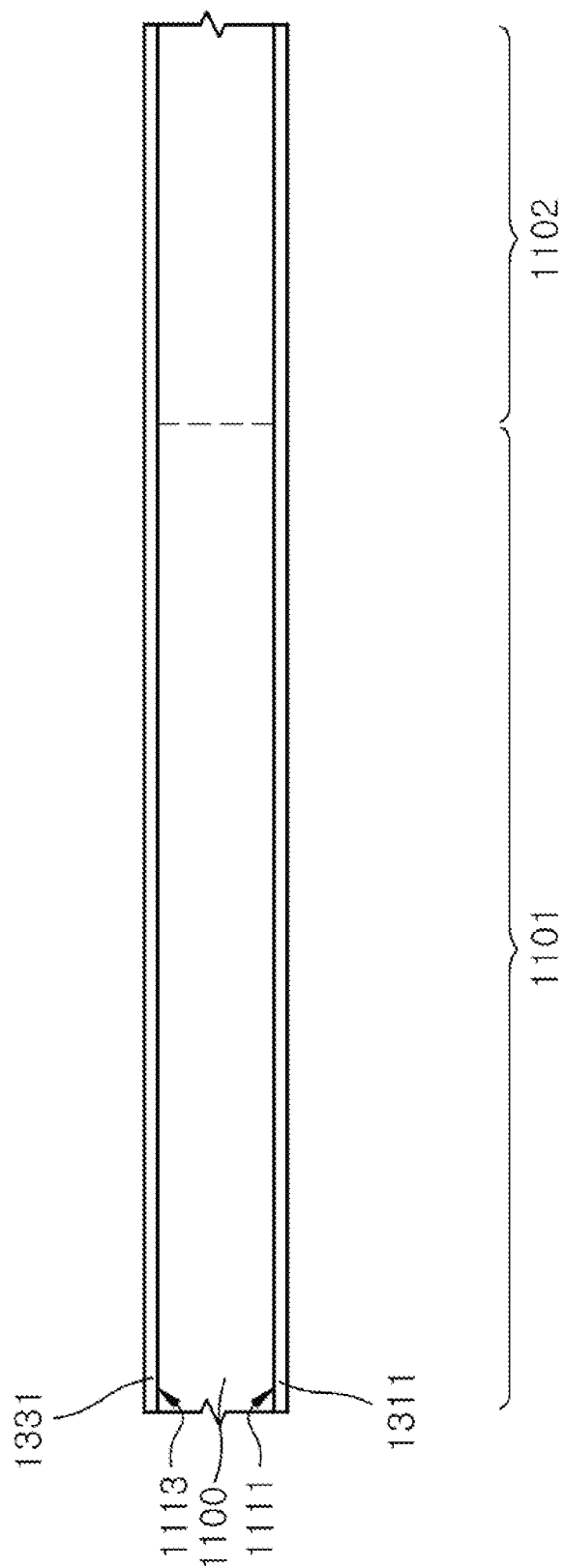
FIGS. 14 to 21 are cross-sectional views illustrating a method of fabricating a semiconductor package according to another embodiment.

Referring to FIG. 14, a substrate body 1100 having a first surface 1111 and a second surface 1113, which are opposite of each other, may be provided. A first seed layer 1311 may be formed on the first surface 1111 of the substrate body 1100, and a second seed layer 1331 may be formed on the second surface 1113 of the substrate body 1100 opposite to the first seed layer 1311. The substrate body 1100 may be divided into a first region 1101 and a second region 1102.

Figure 15:
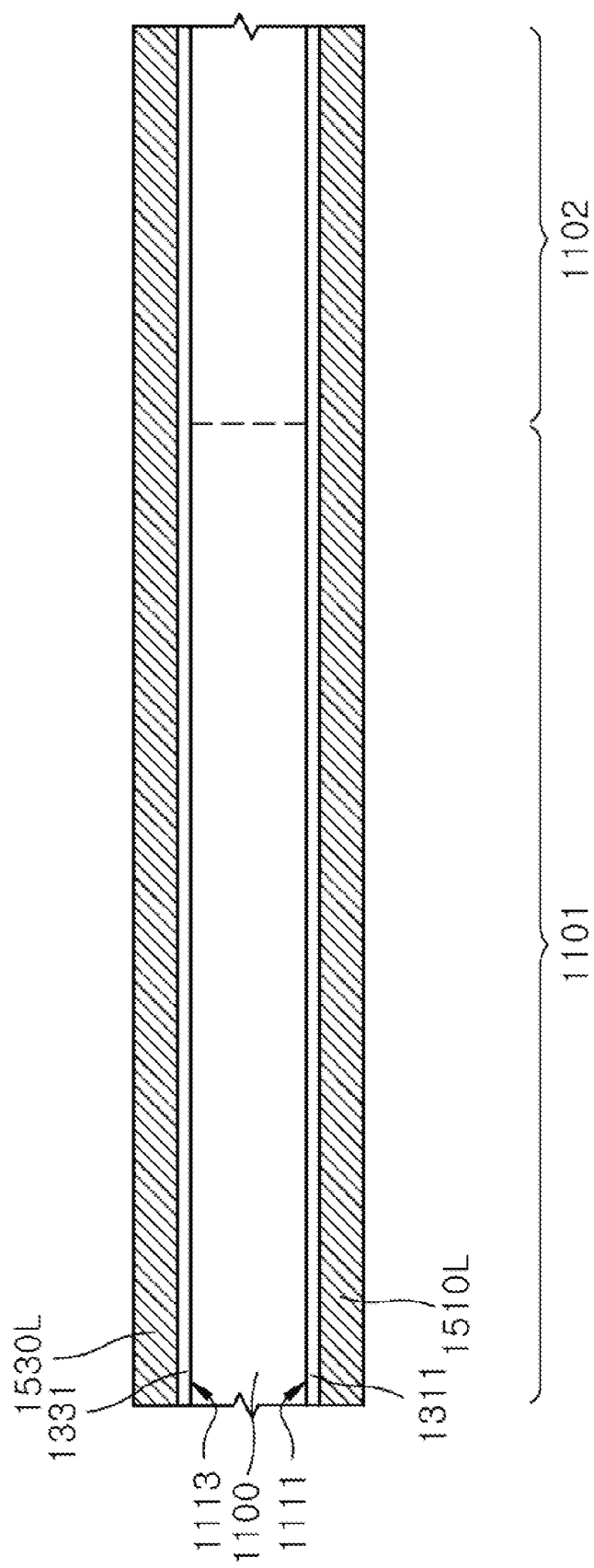

Referring to FIG. 15, a first resist layer 1510L may be formed on the first seed layer 1311. A second resist layer 1530L may be formed on the second seed layer 1331. Each of the first and second resist layers 1510L and 1530L may be formed to include a dry film or a photoresist layer.

Figure 16:
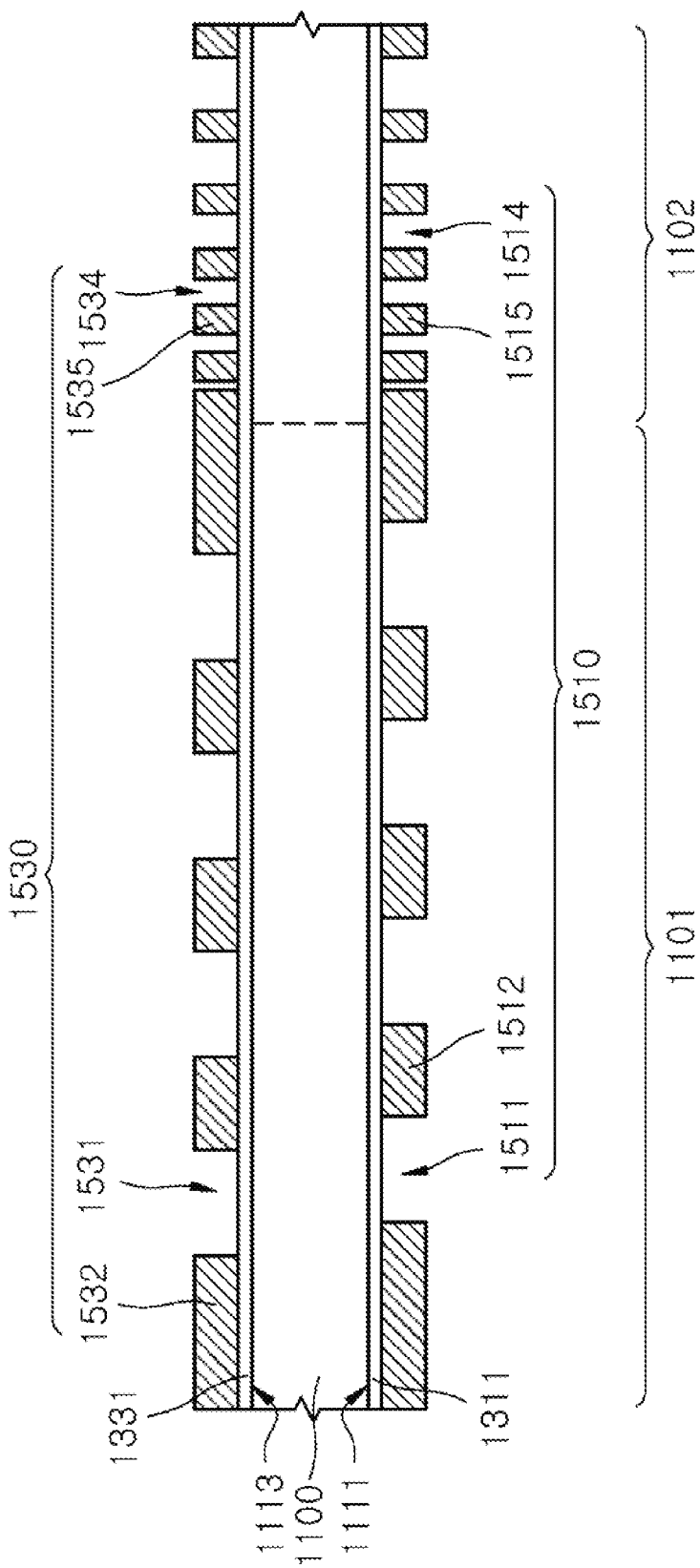

Referring to FIG. 16, the first resist layer 1510L may be patterned using an exposure step and a development step, thereby forming a first resist pattern 1510 on the first seed layer 1311. The second resist layer 1530L may be patterned using an exposure step and a development step, thereby forming a second resist pattern 1530 on the second seed layer 1331.

The first resist pattern 1510 may be formed to include a first circuit resist pattern 1512 providing first circuit openings 1511 on the first region 1101 of the substrate body 1100.

The first circuit resist pattern 1512 may be formed such that the first circuit openings 1511 have the same planar shape as the first circuit patterns (310 of FIG. 9). The first resist pattern 1510 may be formed to include a first monitoring resist pattern 1515 providing first monitoring openings 1514 on the second region 1102 of the substrate body 1100. The first monitoring resist pattern 1515 may be formed such that the first monitoring openings 1514 have the same planar shape as the sub-patterns 451, 452, 453, 454, 455 and 456 of the monitoring pattern 400 illustrated in FIG. 3.

The second resist pattern 1530 may be formed to include a second circuit resist pattern 1532 providing second circuit openings 1531 on the first region 1101 of the substrate body 1100. The second circuit resist pattern 1532 may be formed such that the second circuit openings 1531 have the same planar shape as the second circuit patterns (330 of FIG. 9). The second resist pattern 1530 may be formed to include a second monitoring resist pattern 1535 providing second monitoring openings 1534 on the second region 1102 of the substrate body 1100. The second monitoring resist pattern 1535 may be formed such that the second monitoring openings 1534 have the same planar shape as the sub-patterns 451, 452, 453, 454, 455 and 456 of the monitoring pattern 400 illustrated in FIG. 3.

Figure 17:
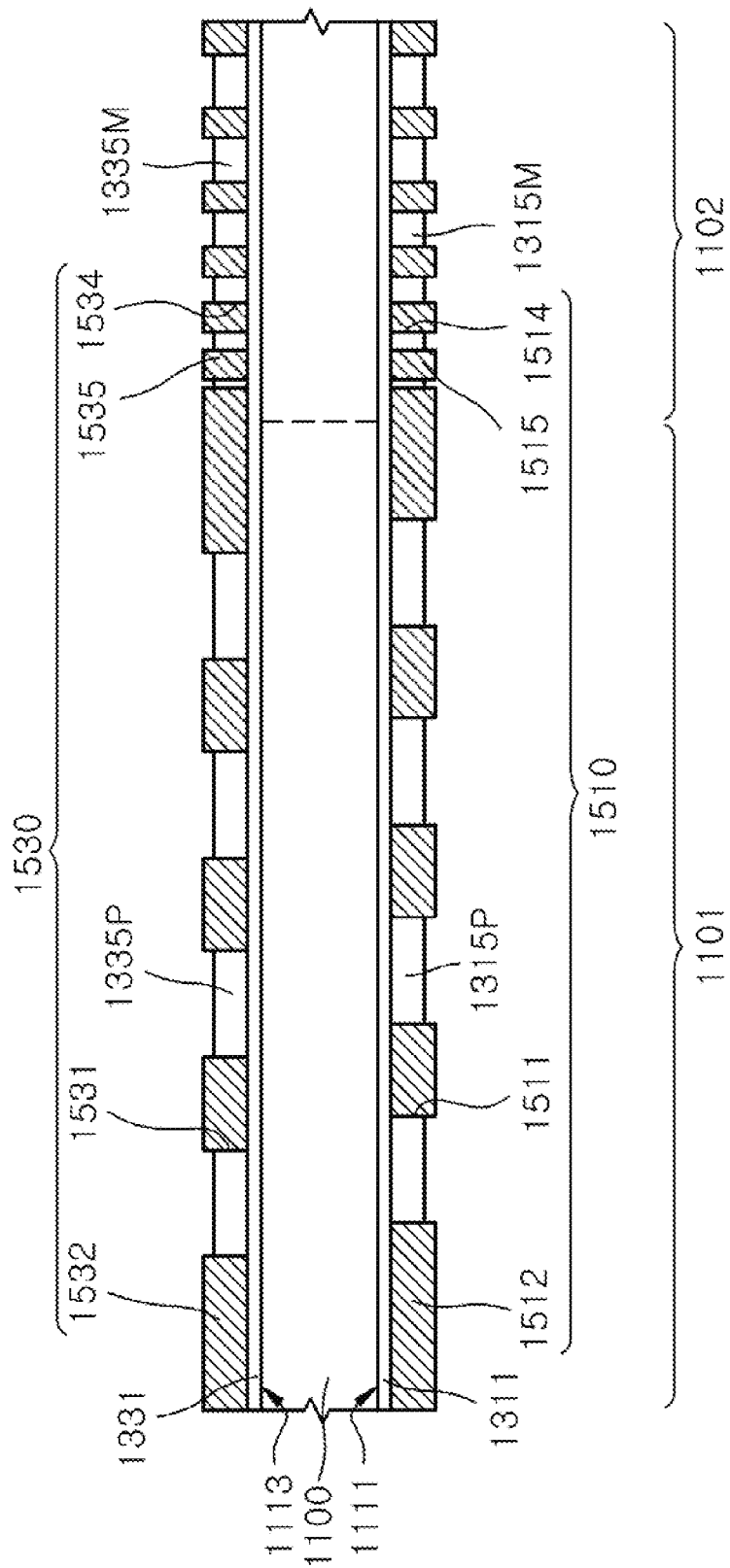

Referring to FIG. 17, first circuit plating layer patterns 1315P and first monitoring plating layer patterns 1315M may be formed on the first seed layer 1311 using the first resist pattern 1510 as a plating mask. Second circuit plating layer patterns 1335P and second monitoring plating layer patterns 1335M may be formed on the second seed layer 1331 using the second resist pattern 1530 as a plating mask. The first circuit plating layer patterns 1315P may be grown by a plating process to fill the first circuit openings 1511, and the sub-patterns corresponding to the first monitoring plating layer patterns 1315M may be grown by a plating process to fill the first monitoring openings 1514. The second circuit plating layer patterns 1335P may be grown by a plating process to fill the second circuit openings 1531, and the sub-patterns corresponding to the second monitoring plating layer patterns 1335M may be grown by a plating process to fill the second monitoring openings 1534.

In the present embodiment, the first and second resist patterns 1510 and 1530 may be used as plating masks unlike the embodiment illustrated in FIG. 7.

Figure 18:
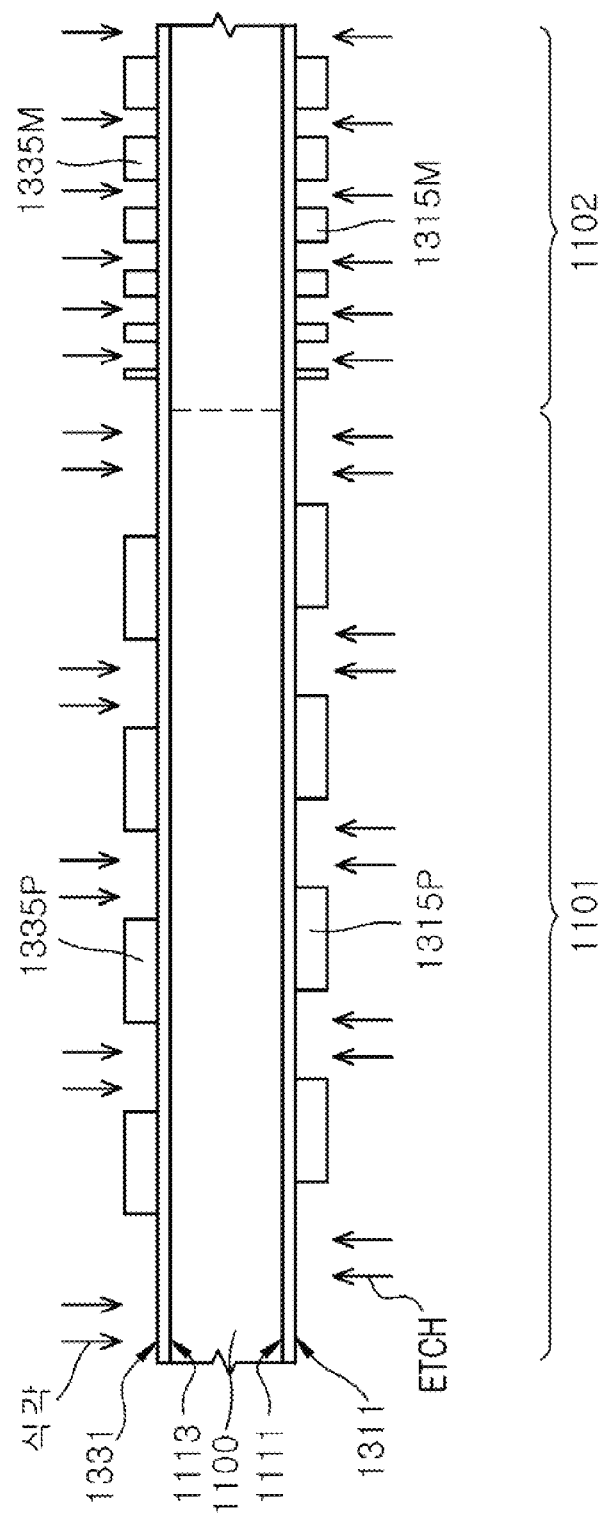

Referring to FIG. 18, the first and second resist patterns 1510 and 1530 may be selectively removed. Specifically, the first circuit resist pattern 1512 and the first monitoring resist pattern 1515 may be removed to expose a portion of the first seed layer 1311, and the second circuit resist pattern 1532 and the second monitoring resist pattern 1535 may be removed to expose a portion of the second seed layer 1331. Subsequently, the exposed portion of the first seed layer 1311 may be removed, and the exposed portion of the second seed layer 1331 may also be removed.

Figure 19:
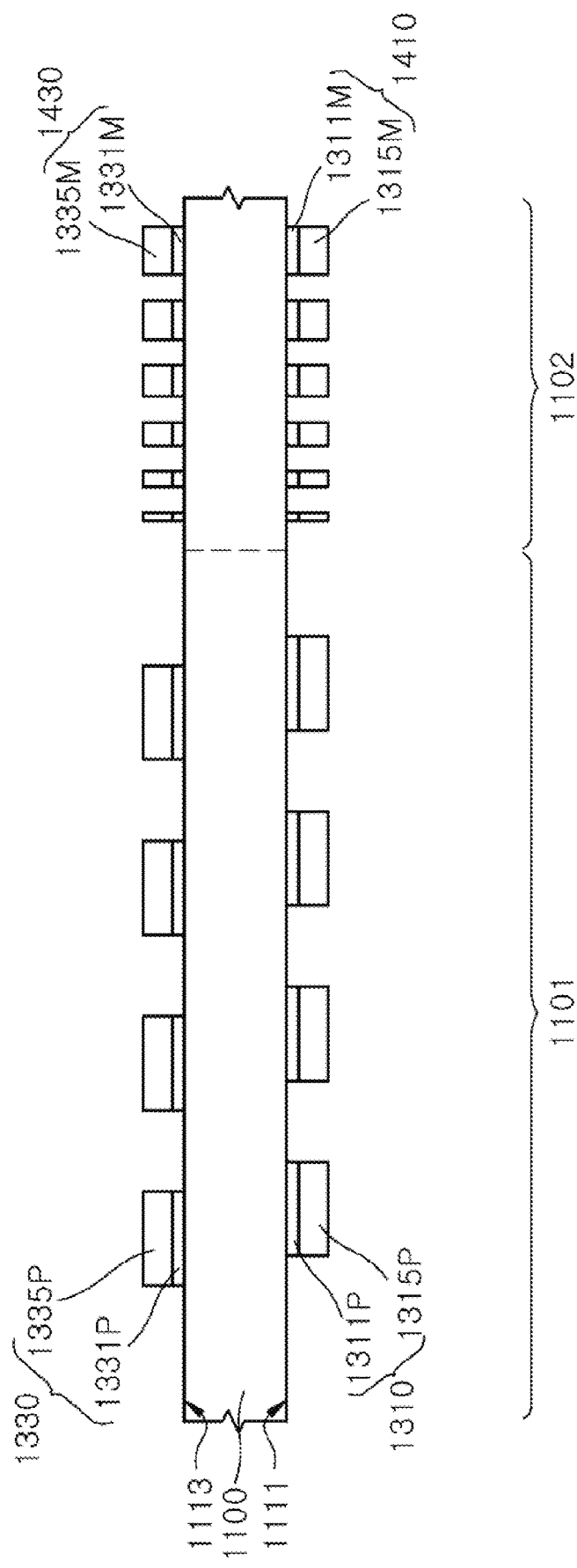

Referring to FIG. 19, as a result of the etch processes described with reference to FIG. 18, first circuit patterns 1310 may be formed on the first surface 1111 of the first region 1101 of the substrate body 1100 and a first monitoring pattern 1410 may be formed on the first surface 1111 of the second region 1102 of the substrate body 1100. Each of the first circuit patterns 1310 may be formed to include a first circuit seed layer pattern 1311P and the first circuit plating layer pattern 1315P which are sequentially stacked on the first surface 1111, and each of sub-patterns constituting the first monitoring pattern 1410 may be formed to include a first monitoring seed layer pattern 1311M and the first monitoring plating layer pattern 1315M which are sequentially stacked on the first surface 1111.

During the etch process for forming the first circuit seed layer patterns 1311P and the first monitoring seed layer patterns 1311M, the first circuit plating layer patterns 1315P and the first monitoring plating layer patterns 1315M may be over-etched to reduce widths of the first circuit patterns 1310 and widths of the sub-patterns of the first monitoring pattern 1410.

As a result of the etch processes described with reference to FIG. 18, second circuit patterns 1330 may be formed on the second surface 1113 of the first region 1101 of the substrate body 1100 and a second monitoring pattern 1430 may be formed on the second surface 1113 of the second region 1102 of the substrate body 1100. Each of the second circuit patterns 1330 may be formed to include a second circuit seed layer pattern 1331P and the second circuit plating layer pattern 1335P which are sequentially stacked on the second surface 1113, and each of sub-patterns constituting the second monitoring pattern 1430 may be formed to include a second monitoring seed layer pattern 1331M and the second monitoring plating layer pattern 1335M which are sequentially stacked on the second surface 1113.

During the etch process for forming the second circuit seed layer patterns 1331P and the second monitoring seed layer patterns 1331M, the second circuit plating layer patterns 1335P and the second monitoring plating layer patterns 1335M may be over-etched to reduce widths of the second circuit patterns 1330 and widths of the sub-patterns of the second monitoring pattern 1430.

The first monitoring pattern 1410 and the first circuit patterns 1310 may be simultaneously formed, and the second monitoring pattern 1430 and the second circuit patterns 1330 may also be simultaneously formed. Thus, an etched amount of the first circuit patterns 1310 may be evaluated by inspecting the first monitoring pattern 1410, and an etched amount of the second circuit patterns 1330 may be evaluated by inspecting the second monitoring pattern 1430.

Figure 20:
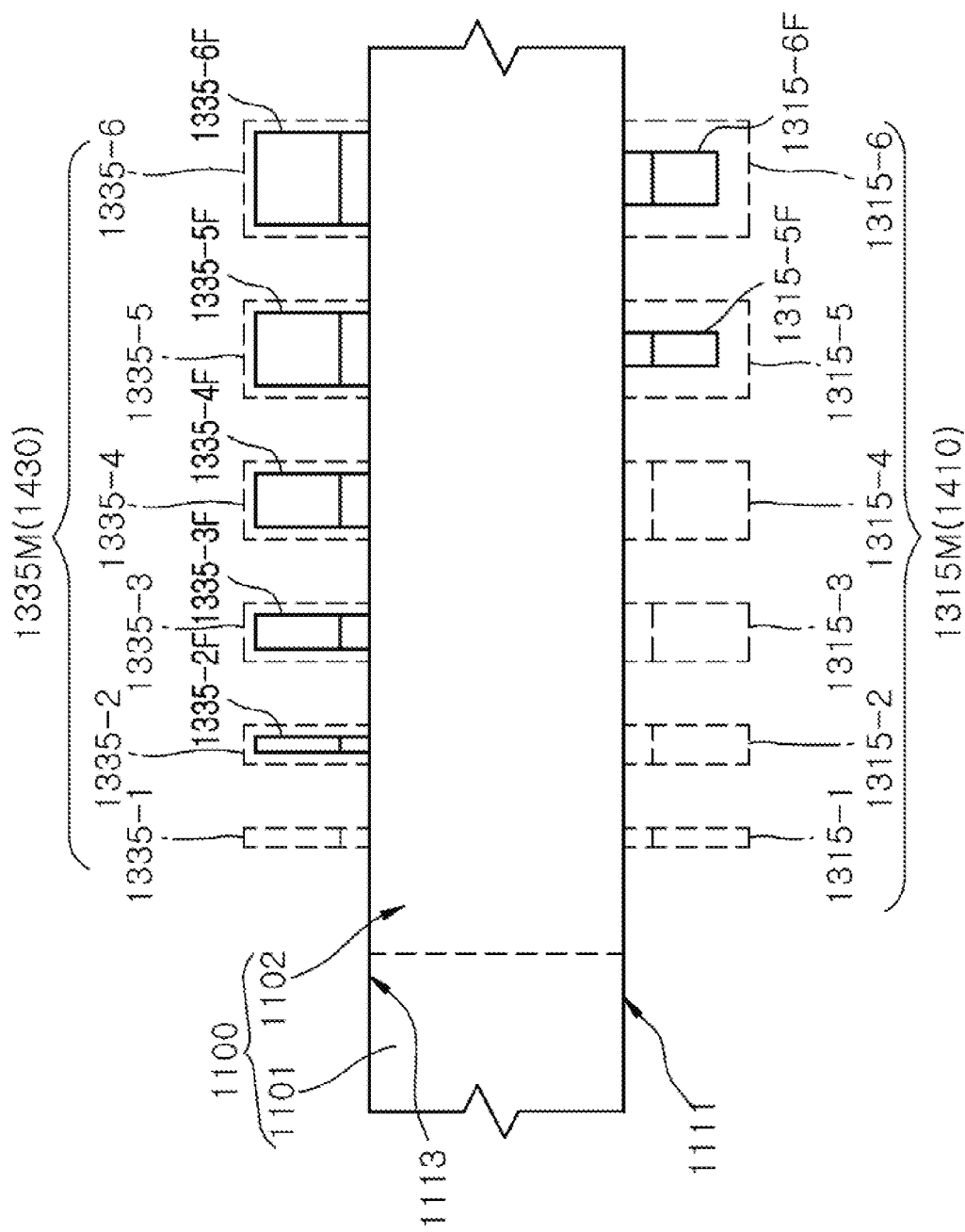

FIG. 20 is an enlarged cross-sectional view illustrating the first monitoring plating layer patterns 1315M of the first monitoring pattern 1410 and the second monitoring plating layer patterns 1335M of the second monitoring pattern 1430 which are formed on the second region 1102 of the substrate body 1100. The first monitoring plating layer patterns 1315M of the first monitoring pattern 1410 grown by a plating process before etching the first seed layer (1311 of FIG. 18) may be formed to include first to sixth sub-patterns 1315-1, 1315-2, 1315-3, 1315-4, 1315-5 and 1315-6 having substantially the same planar shapes as the sub-patterns 451, 452, 453, 454, 455 and 456 of the monitoring pattern 400 illustrated in FIG. 3.

As illustrated in FIGS. 18 and 19, while the first seed layer 1311 is etched, one or more sub-patterns included in the first monitoring plating layer patterns 1315M may be over-etched and removed. For example, the first to fourth sub-patterns 1315-1, 1315-2, 1315-3 and 1315-4 may be removed according to an etch rate or an etch time while the first seed layer 1311 is etched and remaining patterns 1315-5F and 1315-6F of the fifth and sixth sub-patterns 1315-5 and 1315-6 may exist. In such a case, the number of the remaining patterns 1315-5F and 1315-6F may indicate the first residual rate of the first circuit plating layer patterns (1315P of FIG. 19).

The second monitoring plating layer patterns 1335M of the second monitoring pattern 1430 grown by a plating process before etching the second seed layer (1331 of FIG. 18) may be formed to include first to sixth sub-patterns 1335-1, 1335-2, 1335-3, 1335-4, 1335-5 and 1335-6 having substantially the same planar shapes as the sub-patterns 451, 452, 453, 454, 455 and 456 of the monitoring pattern 400 illustrated in FIG. 3.

While the second seed layer 1331 is etched, one or more sub-patterns included in the second monitoring plating layer patterns 1335M may be over-etched and removed. For example, the first sub-pattern 1335-1 may be removed according to an etch rate or an etch time while the second seed layer 1331 is etched and remaining patterns 1335-2F, 1335-3F, 1335-4F, 1335-5F and 1335-6F of the second to sixth sub-patterns 1335-2, 1335-3, 1335-4, 1335-5 and 1335-6 may exist. In such a case, the number of the remaining patterns 1335-2F, 1335-3F, 1335-4F, 1335-5F and 1335-6F may indicate the second residual rate of the second circuit plating layer patterns (1335P of FIG. 19).

The first residual rate of the first circuit plating layer patterns 1315P may be compared with the second residual rate of the second circuit plating layer patterns 1335P to discriminate whether the substrate body 1100 can be used as a good substrate without warpage in a subsequent flip chip bonding process.

Figure 21:
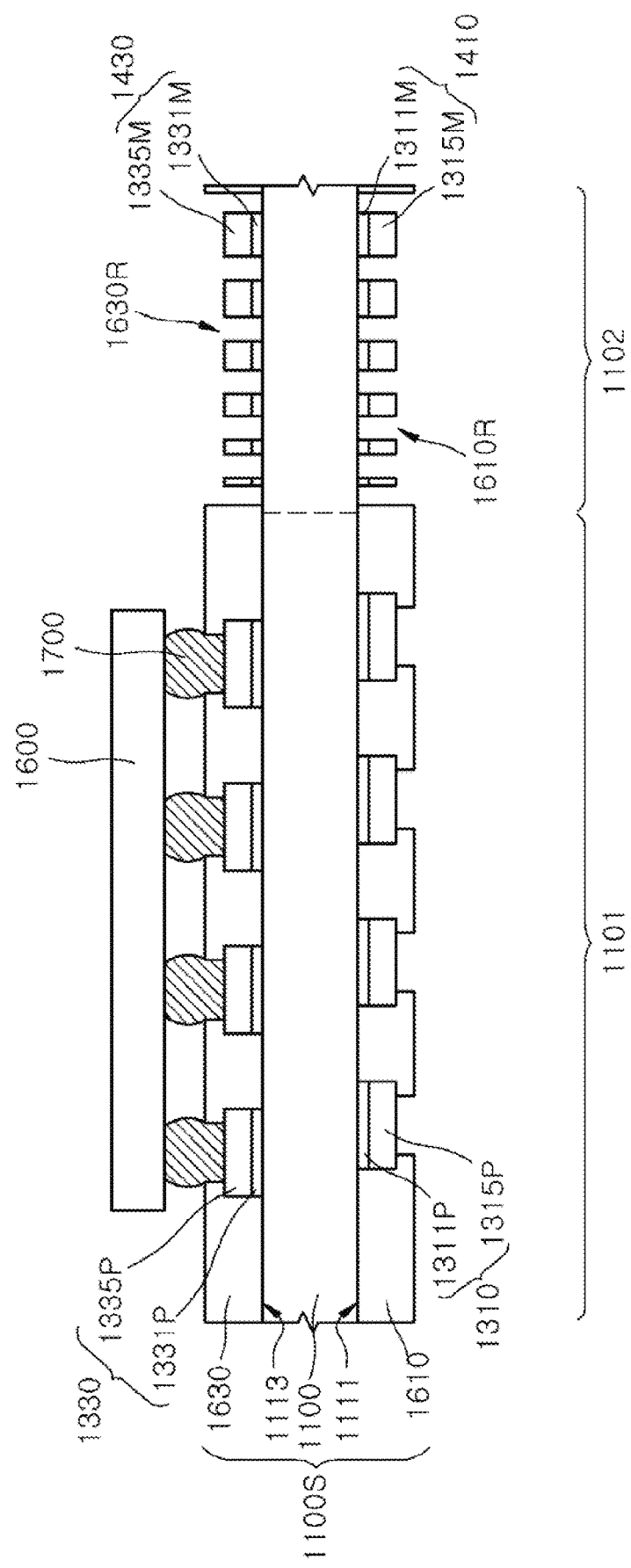

Referring to FIG. 21, if the substrate body 1100 on which the first and second circuit plating layer patterns 1315P and 1335P are formed is classified as a good substrate, a first dielectric layer 1610 may be formed on the first surface 1111 of the substrate body 1100 to expose the first circuit plating layer patterns 1315P. In addition, a second dielectric layer 1630 may be formed on the second surface 1113 of the substrate body 1100 to expose the second circuit plating layer patterns 1335P. The first dielectric layer 1610 may be formed to provide a first dielectric opening 1610R that has a hole shape to expose the first monitoring pattern 1410. The second dielectric layer 1630 may be formed to provide a second dielectric opening 1630R that has a hole shape to expose the second monitoring pattern 1430. The substrate body 1100, the first and second circuit plating layer patterns 1315P and 1335P (acting as first and second circuit patterns), the first and second monitoring patterns 1410 and 1430, and the first and second dielectric layers 1610 and 1630 may constitute a package substrate 1100S.

A semiconductor chip 1600 may be bonded to the package substrate 1100S in a flip chip form. Specifically, inner connectors 1700 attached to the semiconductor chip 1600 may be bonded to the second circuit plating layer patterns 1335P of the package substrate 1100S. As described above, the difference between the first residual rate of the first circuit plating layer patterns 1315P and the second residual rate of the second circuit plating layer patterns 1335P is within the allowable range. Thus, during a flip chip bonding process for bonding the semiconductor chip 1600 to the package substrate 1100S, the warpage of the package substrate 1100S may be effectively suppressed not to cause electrical connection failure between the inner connectors 1700 attached to the semiconductor chip 1600 and the second circuit plating layer patterns 1335P of the package substrate 1100S. The inner connectors 1700 may include conductive bumps.

Since the first and second monitoring patterns 1410 and 1430 are exposed by the first and second dielectric openings 1610R and 1630R, the first and second monitoring patterns 1410 and 1430 may be readily monitored even after the semiconductor chip 1600 is bonded to the package substrate 1100S.

Figure 22:
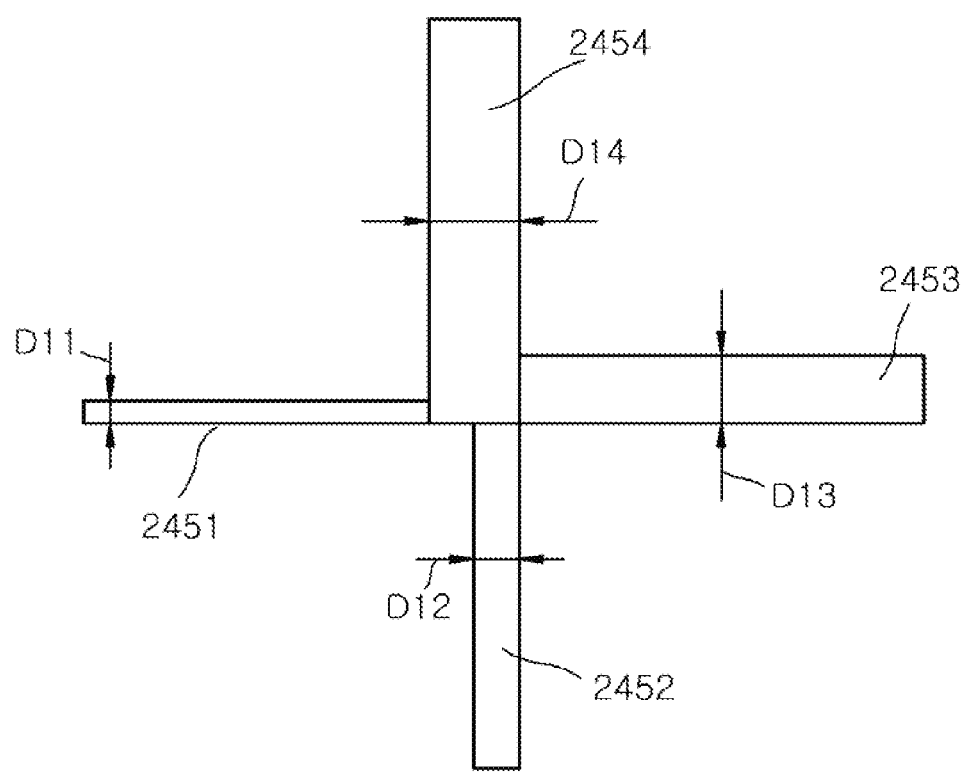
FIGS. 22 and 23 are plan views illustrating layouts of a monitoring pattern employed in a semiconductor package according to an embodiment.

FIG. 22 is a plan view illustrating a layout of a monitoring pattern 2400 employed in a semiconductor package according to an embodiment.

Referring to FIG. 22, the monitoring pattern 2400 may include a plurality of sub-patterns, for example, a first sub-pattern 2151, a second sub-pattern 2152, a third sub-pattern 2153 and a fourth sub-pattern 2154 which have different widths from each other. The first to fourth sub-patterns 2151, 2152, 2153 and 2154 may have first to fourth widths D11, D12, D13 and D14, respectively. The first to fourth sub-patterns 2151, 2152, 2153 and 2154 may be disposed on a plane such that first ends of the first to fourth sub-patterns 2151, 2152, 2153 and 2154 are connected to each other at the same point and second ends of the first to fourth sub-patterns 2151, 2152, 2153 and 2154 are spaced apart from each other. Accordingly, the first to fourth sub-patterns 2151, 2152, 2153 and 2154 may be disposed to have a cross shape or a star shape in a plan view.

Figure 23:
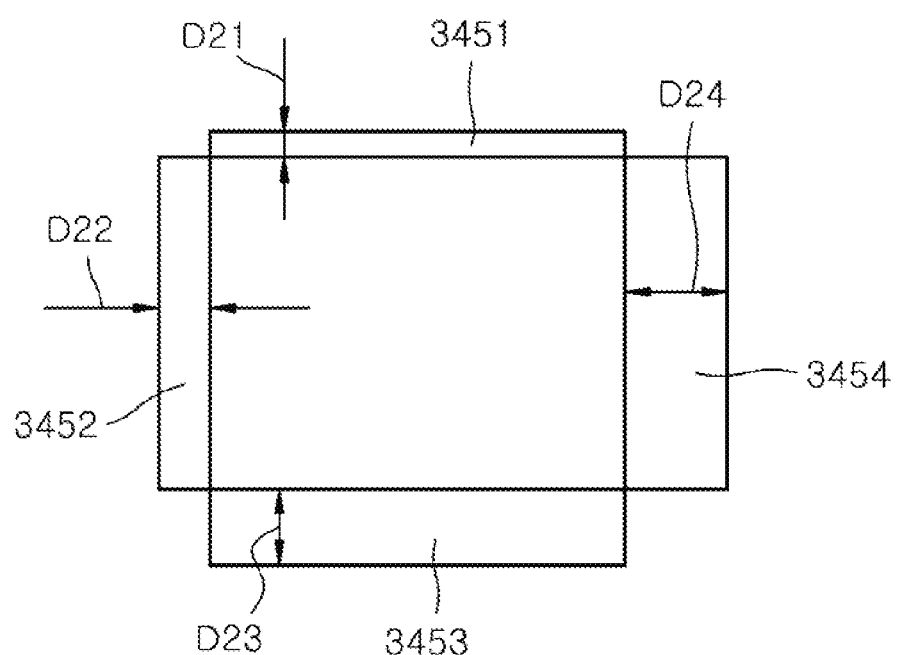

FIG. 23 is a plan view illustrating a layout of a monitoring pattern 3400 employed in a semiconductor package according to an embodiment.

Referring to FIG. 23, the monitoring pattern 3400 may include a plurality of sub-patterns, for example, a first sub-pattern 3151, a second sub-pattern 3152, a third sub-pattern 3153 and a fourth sub-pattern 3154 which have different widths from each other. The first to fourth sub-patterns 3151, 3152, 3153 and 3154 may have first to fourth widths D21, D22, D23 and D24, respectively. The first to fourth sub-patterns 3151, 3152, 3153 and 3154 may be disposed to provide a rectangular closed loop shape in a plan view.

Referring again to FIG. 21, a semiconductor package according to an embodiment may be configured to include the package substrate 1100S and the semiconductor chip 1600 bonded to the package substrate 1100S in a flip chip form. The package substrate 1100S may include the first circuit patterns 1310 formed on the first surface 1111 of the substrate body 1100 and the second circuit patterns 1330 formed on the second surface 1113 of the substrate body 1100 opposite to the first circuit patterns 1310.

The first monitoring pattern 1410 may also be disposed on the first surface 1111 of the substrate body 1100. The first monitoring pattern 1410 may include a first group of the sub-patterns 1315-1, 1315-2, 1315-3, 1315-4, 1315-5 and 1315-6 which are formed to have different widths from each other, as illustrated in FIG. 20. The first monitoring pattern 1410 may be designed such that the number of remaining patterns among the first group of the sub-patterns 1315-1, 1315-2, 1315-3, 1315-4, 1315-5 and 1315-6 indicates the first residual rate of the first circuit patterns 1310.

The second monitoring pattern 1430 may be disposed on the second surface 1113 of the substrate body 1100. The second monitoring pattern 1430 may include a second group of the sub-patterns 1335-1, 1335-2, 1335-3, 1335-4, 1335-5 and 1335-6 which are formed to have different widths from each other, as illustrated in FIG. 20. The second monitoring pattern 1430 may be designed such that the number of remaining patterns among the second group of the sub-patterns 1335-1, 1335-2, 1335-3, 1335-4, 1335-5 and 1335-6 indicates the second residual rate of the second circuit patterns 1330.

The inner connectors 1700 attached to the semiconductor chip 1600 may be bonded to the second circuit patterns 1330 of the package substrate 1100S. Although not shown in the drawings, a molding layer may be additionally formed on the package substrate 1100S to cover and encapsulate the semiconductor chip 1700 corresponding to a flip chip.

According to the embodiments, there are provided methods of monitoring a first residual rate of first circuit patterns formed on a first surface of a substrate body and a second residual rate of second circuit patterns formed on a second surface of the substrate body using monitoring patterns while a semiconductor package is fabricated. A package substrate including the substrate body and the first and second circuit patterns may be classified as either a good substrate or a failed substrate in terms of warpage by calculating a difference between the first residual rate and the second residual rate before a semiconductor chip is bonded to the package substrate. If the difference between the first residual rate and the second residual rate is within an allowable range, the semiconductor chip may then be bonded to the package substrate. Thus, it may be possible to previously prevent electrical connection failure between the semiconductor chip and the package substrate from occurring due to warpage of the package substrate during a chip bonding process for electrically connecting the semiconductor chip to the package substrate. Accordingly, the reliability of the semiconductor package may be improved.

Figure 24:
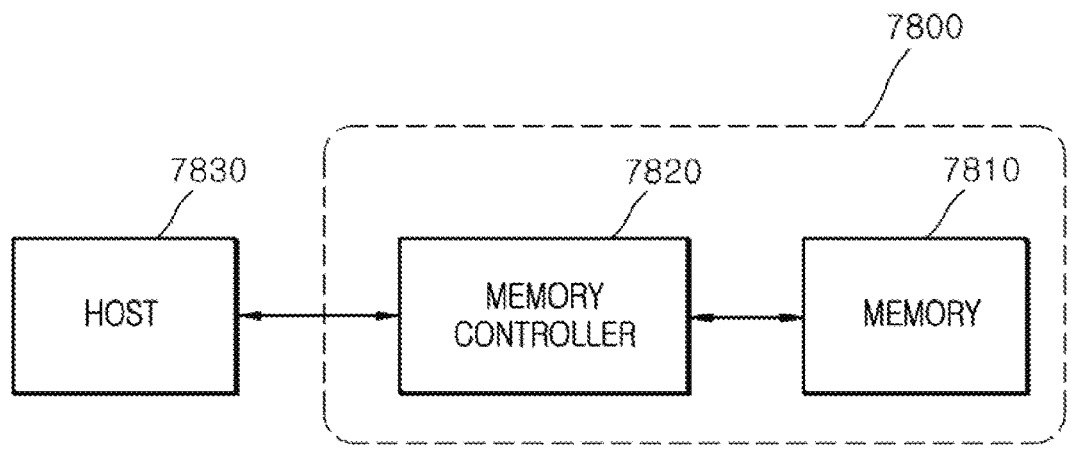
FIG. 24 is a block diagram illustrating an electronic system employing a memory card including a semiconductor package according to an embodiment.

FIG. 24 is a block diagram illustrating an electronic system including a memory card 7800 employing at least one of the semiconductor packages according to the embodiments. The memory card 7800 includes a memory 7810 such as a nonvolatile memory device, and a memory controller 7820. The memory 7810 and the memory controller 7820 may store data or read out the stored data. At least one of the memory 7810 and the memory controller 7820 may include at least one of the semiconductor packages according to the embodiments.

The memory 7810 may include a nonvolatile memory device to which the technology of the embodiments of the present disclosure is applied. The memory controller 7820 may control the memory 7810 such that stored data is read out or data is stored in response to a read/write request from a host 7830.

Figure 25:
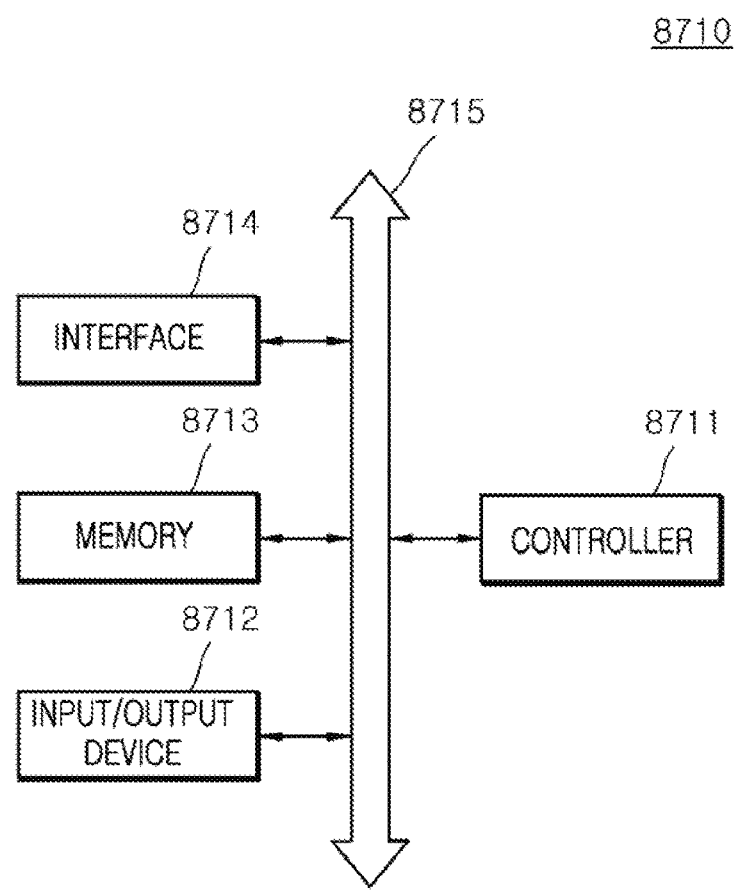
FIG. 25 is a block diagram illustrating another electronic system including a semiconductor package according to an embodiment.

FIG. 25 is a block diagram, illustrating an electronic system 8710, including at least one of the semiconductor packages according to the embodiments. The electronic system 8710 may include a controller 8711, an input/output device 8712 and a memory 8713. The controller 8711, the input/output device 8712 and the memory 8713 may be coupled with one another through a bus 8715 providing a path through which data move.

In an embodiment, the controller 8711 may include one or more microprocessor, digital signal processor, microcontroller, and/or logic device capable of performing the same functions as these components. The controller 8711 or the memory 8713 may include one or more of the semiconductor packages according to the embodiments of the present disclosure. The input/output device 8712 may include at least one selected among a keypad, a keyboard, a display device, a touchscreen and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer or a logic system performing various functions. For example, the mobile system may be any one of a personal digital assistant (PDA), a portable computer, a tablet computer, a mobile phone, a smart phone, a wireless phone, a laptop computer, a memory card, a digital music system and an information transmission/reception system.

If the electronic system 8710 is an equipment capable of performing wireless communication, the electronic system 8710 may be used in a communication system using a technique of CDMA (code division multiple access), GSM (global system for mobile communications), NADC (north American digital cellular), E-TDMA (enhanced-time division multiple access), WCDMA (wideband code division multiple access), CDMA2000, LTE (long term evolution) or Wibro (wireless broadband Internet).

Embodiments of the present disclosure have been disclosed for illustrative purposes. Those skilled in the art will appreciate that various modifications, additions and substitutions are possible, without departing from the scope and spirit of the present disclosure and the accompanying claims.

What is claimed is:

1. A method of fabricating a semiconductor package, the method comprising:
   forming a first plating layer on a first surface of a substrate body;
   forming first circuit resist patterns and first monitoring resist patterns, each of the first monitoring resist patterns having different widths, on the first plating layer;
   etching the first plating layer to form first circuit patterns and a first monitoring pattern by using the first circuit resist patterns and the first monitoring resist patterns as etch masks, wherein the first monitoring pattern includes sub-patterns which are etched from a portion of the first plating layer;
   monitoring a first residual rate of the first circuit patterns by inspecting a number of the etched sub-patterns of the first monitoring pattern remaining on the first surface of the substrate body.

2. The method of claim 1, wherein the first monitoring resist patterns are formed by transferring an image of a layout of a monitoring pattern, with different widths, onto the first plating layer.

3. The method of claim 1, wherein the method further comprises bonding inner connectors, which are attached to a semiconductor chip, to the first circuit patterns.

4. The method of claim 3, wherein bonding the inner connectors to the second circuit patterns is preceded by:
   forming a second plating layer on a second surface of the substrate body, the second surface being on an opposite side of the first surface of the substrate body;
   forming second circuit resist patterns and second monitoring resist patterns on the second plating layer, wherein the second monitoring resist patterns are formed by transferring an image of the layout of a monitoring pattern onto the second plating layer;
   etching the second plating layer using the second circuit resist patterns and the second monitoring resist patterns as etch masks to form second circuit patterns and a second monitoring pattern, wherein the second monitoring pattern is formed to include etched sub-patterns; and
   monitoring a second residual rate of the second circuit patterns by inspecting the number of the etched sub-patterns of the second monitoring pattern remaining on the second surface of the substrate body.

5. The method of claim 4, wherein the second monitoring pattern is formed to overlap with the first monitoring pattern in a plan view.

6. The method of claim 4, wherein bonding the inner connectors to the first circuit patterns is performed when a difference between the first residual rate and the second residual rate is within an allowable range.

7. The method of claim 6, wherein the allowable range is set to be 6%.

8. The method of claim 1,
wherein the sub-patterns of the monitoring pattern include first to $M^{th}$ sub-patterns (where, 'M' is a natural number which is equal to or greater than two); and
wherein an $N^{th}$ sub-pattern among the first to $M^{th}$ sub-patterns is designed to have a width which is 'N' times a width of the first sub-pattern (where, 'N' denotes a natural number which is greater than one and less than (M+1)).

9. The method of claim 1, wherein the sub-patterns of the monitoring pattern are designed to be etched and sequentially removed, one by one, whenever the first residual rate of the first circuit patterns is reduced by a predetermined unit value.

10. The method of claim 1, wherein the sub-patterns of the monitoring pattern are designed to be line-shaped patterns, which are disposed side by side and spaced apart from each other.

11. The method of claim 1,
wherein the sub-patterns of the monitoring pattern are designed to be line-shaped patterns; and
wherein first ends of the sub-patterns of the monitoring pattern are connected to each other at the same point, and second ends of the sub-patterns are spaced apart from each other, when viewed from a plan view.

12. The method of claim 1,
wherein the sub-patterns of the monitoring pattern are designed to be line-shaped patterns; and
wherein the sub-patterns are connected to each other to provide a polygonal closed loop shape in a plan view.

13. The method of claim 1, further comprising forming a first seed layer on the first surface of the substrate body before forming the first plating layer.

* * * * *